(12) United States Patent
Yamamoto et al.

(10) Patent No.: US 11,705,140 B2
(45) Date of Patent: *Jul. 18, 2023

(54) DECODING APPARATUS AND METHOD, AND PROGRAM

(71) Applicant: Sony Corporation, Tokyo (JP)

(72) Inventors: Yuki Yamamoto, Tokyo (JP); Toru Chinen, Kanagawa (JP); Hiroyuki Honma, Chiba (JP); Runyu Shi, Tokyo (JP)

(73) Assignee: Sony Corporation, Tokyo (JP)

( * ) Notice: Subject to any disclaimer, the term of this patent is extended or adjusted under 35 U.S.C. 154(b) by 223 days.

This patent is subject to a terminal disclaimer.

(21) Appl. No.: 16/867,730

(22) Filed: May 6, 2020

(65) Prior Publication Data

US 2020/0265845 A1    Aug. 20, 2020

Related U.S. Application Data

(63) Continuation of application No. 15/106,498, filed as application No. PCT/JP2014/082925 on Dec. 12, 2014, now Pat. No. 10,692,511.

(30) Foreign Application Priority Data

Dec. 27, 2013 (JP) .............................. JP2013-272943

(51) Int. Cl.
*G10L 19/02* (2013.01)
*H03G 7/00* (2006.01)
(Continued)

(52) U.S. Cl.
CPC .............. *G10L 19/02* (2013.01); *G10L 19/26* (2013.01); *H03G 7/002* (2013.01); *H03G 7/007* (2013.01);
(Continued)

(58) Field of Classification Search
None
See application file for complete search history.

(56) References Cited

U.S. PATENT DOCUMENTS

| 4,628,529 | A | 12/1986 | Borth et al. |
| 4,817,151 | A | 3/1989 | Bod et al. |

(Continued)

FOREIGN PATENT DOCUMENTS

| CA | 2775387 A1 | 4/2011 |
| CN | 1283007 A | 2/2001 |

(Continued)

OTHER PUBLICATIONS

Brazilian Office Action dated Sep. 28, 2020 in connection with Brazilian Application No. BR112016014476, and English translation thereof.

(Continued)

*Primary Examiner* — Neeraj Sharma
(74) *Attorney, Agent, or Firm* — Wolf, Greenfield & Sacks, P.C.

(57) ABSTRACT

The present technology relates to a decoding apparatus, a decoding method and a program which make it possible to obtain sound with higher quality.
A demultiplexing circuit demultiplexes an input code string into a gain code string and a signal code string. A signal decoding circuit decodes the signal code string to output a time series signal. A gain decoding circuit decodes the gain code string. That is, the gain decoding circuit reads out gain values and gain inclination values at predetermined gain sample positions of the time series signal and interpolation mode information. An interpolation processing unit obtains a gain value at each sample position between two gain sample positions through linear interpolation or non-linear interpolation according to the interpolation mode based on the gain values and the gain inclination values. A gain (Continued)

applying circuit adjusts a gain of the time series signal based on the gain values. The present technology can be applied to a decoding apparatus.

10 Claims, 17 Drawing Sheets

(51) Int. Cl.
- *H03G 11/00* (2006.01)
- *G10L 19/26* (2013.01)
- *H03G 9/00* (2006.01)
- *G10L 21/034* (2013.01)

(52) U.S. Cl.
CPC ........... *H03G 9/005* (2013.01); *H03G 11/008* (2013.01); *G10L 21/034* (2013.01); *H03G 9/00* (2013.01)

(56) References Cited

U.S. PATENT DOCUMENTS

| | | | |
|---|---|---|---|
| 5,640,490 A | 6/1997 | Hansen et al. | |
| 5,651,092 A | 7/1997 | Ishii et al. | |
| 5,664,055 A | 9/1997 | Kroon | |
| 5,687,157 A | 11/1997 | Imai et al. | |
| 5,749,064 A * | 5/1998 | Pawate | G10H 1/366 704/211 |
| 5,913,194 A * | 6/1999 | Karaali | G10L 13/02 704/265 |
| 5,956,674 A | 9/1999 | Smyth et al. | |
| 6,022,222 A | 2/2000 | Guinan | |
| 6,073,100 A | 6/2000 | Goodridge, Jr. | |
| 6,415,251 B1 | 7/2002 | Oikawa et al. | |
| 6,657,492 B1 * | 12/2003 | Perthold | H03F 1/3247 330/149 |
| 6,708,145 B1 | 3/2004 | Liljeryd et al. | |
| 6,782,366 B1 | 8/2004 | Huang et al. | |
| 6,829,360 B1 | 12/2004 | Iwata et al. | |
| 6,895,375 B2 | 5/2005 | Malah et al. | |
| 7,003,451 B2 | 2/2006 | Kjorling et al. | |
| 7,013,011 B1 * | 3/2006 | Weeks | H03G 9/025 381/98 |
| 7,069,212 B2 | 6/2006 | Tanaka et al. | |
| 7,139,702 B2 | 11/2006 | Tsushima et al. | |
| 7,242,710 B2 | 7/2007 | Ekstrand | |
| 7,246,065 B2 | 7/2007 | Tanaka et al. | |
| 7,283,955 B2 | 10/2007 | Liljeryd et al. | |
| 7,318,035 B2 | 1/2008 | Andersen et al. | |
| 7,330,812 B2 | 2/2008 | Ding | |
| 7,337,118 B2 | 2/2008 | Davidson et al. | |
| 7,447,631 B2 | 11/2008 | Truman et al. | |
| 7,653,146 B2 | 1/2010 | Kisovec et al. | |
| 7,899,676 B2 | 3/2011 | Honma et al. | |
| 7,941,315 B2 | 5/2011 | Matsuo | |
| 7,974,847 B2 | 7/2011 | Kjoerling et al. | |
| 7,983,424 B2 | 7/2011 | Kjorling et al. | |
| 7,991,621 B2 | 8/2011 | Oh et al. | |
| 8,014,534 B2 | 9/2011 | Henn et al. | |
| 8,019,614 B2 | 9/2011 | Takagi et al. | |
| 8,032,387 B2 | 10/2011 | Davidson et al. | |
| 8,050,933 B2 | 11/2011 | Davidson et al. | |
| 8,063,809 B2 | 11/2011 | Liu et al. | |
| 8,078,474 B2 | 12/2011 | Vos et al. | |
| 8,126,162 B2 | 2/2012 | Zhang et al. | |
| 8,144,804 B2 | 3/2012 | Chinen et al. | |
| 8,145,475 B2 | 3/2012 | Kjoerling et al. | |
| 8,244,524 B2 | 8/2012 | Shirakawa et al. | |
| 8,255,231 B2 | 8/2012 | Villemoes et al. | |
| 8,260,609 B2 | 9/2012 | Rajendran et al. | |
| 8,321,229 B2 | 11/2012 | Choo et al. | |
| 8,332,210 B2 | 12/2012 | Nilsson et al. | |
| 8,340,213 B2 | 12/2012 | Chinen et al. | |
| 8,346,566 B2 | 1/2013 | Kjoerling et al. | |
| 8,352,249 B2 | 1/2013 | Chong et al. | |
| 8,364,474 B2 | 1/2013 | Honma et al. | |
| 8,370,133 B2 | 2/2013 | Taleb et al. | |
| 8,386,243 B2 | 2/2013 | Nilsson et al. | |
| 8,392,200 B2 | 3/2013 | Chivukula et al. | |
| 8,407,020 B1 * | 3/2013 | Baggenstoss | G06F 17/141 702/75 |
| 8,407,046 B2 | 3/2013 | Gao | |
| 8,423,371 B2 | 4/2013 | Yamanashi et al. | |
| 8,433,582 B2 | 4/2013 | Ramabadran et al. | |
| 8,463,599 B2 | 6/2013 | Ramabadran et al. | |
| 8,463,602 B2 | 6/2013 | Oshikiri | |
| 8,484,036 B2 | 7/2013 | Vos | |
| 8,498,344 B2 | 7/2013 | Wilson et al. | |
| 8,527,283 B2 | 9/2013 | Jasiuk et al. | |
| 8,560,330 B2 | 10/2013 | Gao | |
| 8,688,441 B2 | 4/2014 | Ramabadran et al. | |
| 8,793,126 B2 | 7/2014 | Gao | |
| 8,818,541 B2 | 8/2014 | Villemoes et al. | |
| 8,949,119 B2 | 2/2015 | Yamamoto et al. | |
| 8,972,248 B2 | 3/2015 | Otani et al. | |
| 9,047,875 B2 | 6/2015 | Gao | |
| 9,171,549 B2 | 10/2015 | Hoffmann | |
| 9,177,563 B2 | 11/2015 | Yamamoto et al. | |
| 9,208,795 B2 | 12/2015 | Yamamoto et al. | |
| 9,294,062 B2 | 3/2016 | Hatanaka et al. | |
| 9,305,557 B2 | 4/2016 | Nagel et al. | |
| 9,361,900 B2 | 6/2016 | Yamamoto et al. | |
| 9,390,717 B2 | 7/2016 | Yamamoto et al. | |
| 9,406,306 B2 | 8/2016 | Yamamoto et al. | |
| 9,406,312 B2 | 8/2016 | Yamamoto et al. | |
| 9,437,197 B2 | 9/2016 | Honma et al. | |
| 9,437,198 B2 | 9/2016 | Hatanaka et al. | |
| 9,536,542 B2 | 1/2017 | Yamamoto et al. | |
| 9,542,952 B2 | 1/2017 | Hatanaka et al. | |
| 9,576,593 B2 | 2/2017 | Pakhomov et al. | |
| 9,583,112 B2 | 2/2017 | Yamamoto et al. | |
| 9,659,573 B2 | 5/2017 | Yamamoto et al. | |
| 9,679,580 B2 | 6/2017 | Yamamoto et al. | |
| 9,691,410 B2 | 6/2017 | Yamamoto et al. | |
| 9,767,814 B2 | 9/2017 | Yamamoto et al. | |
| 9,767,824 B2 | 9/2017 | Yamamoto et al. | |
| 9,841,941 B2 | 12/2017 | Riedmiller et al. | |
| 9,842,603 B2 | 12/2017 | Yamamoto et al. | |
| 9,875,746 B2 | 1/2018 | Honma et al. | |
| 10,083,700 B2 | 9/2018 | Hatanaka et al. | |
| 10,140,995 B2 | 11/2018 | Hatanaka et al. | |
| 10,224,054 B2 | 3/2019 | Yamamoto et al. | |
| 10,297,270 B2 | 5/2019 | Yamamoto et al. | |
| 10,304,466 B2 | 5/2019 | Hatanaka et al. | |
| 10,381,018 B2 | 8/2019 | Yamamoto et al. | |
| 10,431,229 B2 | 10/2019 | Hatanaka et al. | |
| 10,546,594 B2 | 1/2020 | Yamamoto et al. | |
| 10,643,630 B2 | 5/2020 | Hatanaka et al. | |
| 10,692,511 B2 | 6/2020 | Yamamoto et al. | |
| 2002/0128835 A1 | 9/2002 | Iso | |
| 2003/0033142 A1 | 2/2003 | Murashima | |
| 2003/0055655 A1 | 3/2003 | Souminen | |
| 2003/0093271 A1 | 5/2003 | Tsushima et al. | |
| 2003/0093278 A1 | 5/2003 | Malah | |
| 2003/0187663 A1 | 10/2003 | Truman et al. | |
| 2003/0233234 A1 | 12/2003 | Truman et al. | |
| 2004/0028244 A1 | 2/2004 | Tsushima et al. | |
| 2004/0176062 A1 * | 9/2004 | Hsieh | H03D 3/006 455/221 |
| 2005/0004793 A1 | 1/2005 | Ojala et al. | |
| 2005/0047586 A1 | 3/2005 | Li | |
| 2005/0060146 A1 | 3/2005 | Oh | |
| 2005/0096917 A1 | 5/2005 | Kjorling et al. | |
| 2005/0143985 A1 | 6/2005 | Sung et al. | |
| 2005/0171785 A1 | 8/2005 | Nomura et al. | |
| 2005/0204904 A1 | 9/2005 | Lengeling et al. | |
| 2005/0267763 A1 | 12/2005 | Ojanpera | |
| 2006/0031075 A1 | 2/2006 | Oh et al. | |
| 2006/0039682 A1 | 2/2006 | Chen et al. | |
| 2006/0106620 A1 | 5/2006 | Thompson et al. | |
| 2006/0111899 A1 | 5/2006 | Padhi et al. | |
| 2006/0136199 A1 | 6/2006 | Nongpiur et al. | |
| 2006/0146961 A1 * | 7/2006 | Kim | H04L 27/0014 375/334 |

(56) References Cited

U.S. PATENT DOCUMENTS

| | | | |
|---|---|---|---|
| 2006/0149532 A1* | 7/2006 | Boillot | G10L 19/26 704/203 |
| 2006/0242325 A1 | 10/2006 | Ramaswamy et al. | |
| 2006/0251178 A1 | 11/2006 | Oshikiri | |
| 2006/0271356 A1 | 11/2006 | Vos | |
| 2007/0005351 A1 | 1/2007 | Sathyendra et al. | |
| 2007/0040709 A1 | 2/2007 | Sung et al. | |
| 2007/0071116 A1 | 3/2007 | Oshikiri | |
| 2007/0088541 A1 | 4/2007 | Vos et al. | |
| 2007/0150267 A1 | 6/2007 | Honma et al. | |
| 2007/0160219 A1* | 7/2007 | Jakka | H04S 3/004 381/22 |
| 2007/0165869 A1 | 7/2007 | Ojanpera | |
| 2007/0174063 A1 | 7/2007 | Mehrotra et al. | |
| 2007/0219785 A1 | 9/2007 | Gao | |
| 2007/0282599 A1 | 12/2007 | Choo et al. | |
| 2007/0296614 A1 | 12/2007 | Lee et al. | |
| 2007/0299656 A1 | 12/2007 | Son et al. | |
| 2008/0027733 A1 | 1/2008 | Oshikiri et al. | |
| 2008/0056511 A1 | 3/2008 | Zhang et al. | |
| 2008/0097751 A1 | 4/2008 | Tsuchinaga et al. | |
| 2008/0120118 A1 | 5/2008 | Choo et al. | |
| 2008/0129350 A1 | 6/2008 | Mitsufuji et al. | |
| 2008/0140425 A1 | 6/2008 | Shimada | |
| 2008/0219344 A1 | 9/2008 | Suzuki et al. | |
| 2008/0253587 A1 | 10/2008 | Une | |
| 2008/0262835 A1 | 10/2008 | Oshikiri | |
| 2008/0263285 A1 | 10/2008 | Sharma et al. | |
| 2008/0270125 A1 | 10/2008 | Choo et al. | |
| 2009/0048846 A1 | 2/2009 | Smaragdis et al. | |
| 2009/0132238 A1 | 5/2009 | Sudhakar | |
| 2009/0154726 A1* | 6/2009 | Taenzer | G10L 25/78 381/94.1 |
| 2009/0157413 A1 | 6/2009 | Oshikiri | |
| 2009/0171673 A1 | 7/2009 | Yamanashi et al. | |
| 2009/0192792 A1 | 7/2009 | Lee et al. | |
| 2009/0228284 A1 | 9/2009 | Moon et al. | |
| 2009/0234657 A1 | 9/2009 | Takagi et al. | |
| 2009/0248407 A1 | 10/2009 | Oshikiri | |
| 2009/0265167 A1 | 10/2009 | Ehara et al. | |
| 2009/0271204 A1 | 10/2009 | Tammi | |
| 2009/0274310 A1 | 11/2009 | Taenzer | |
| 2009/0281811 A1 | 11/2009 | Oshikiri et al. | |
| 2009/0326349 A1* | 12/2009 | McGonigle | A61B 5/726 600/323 |
| 2010/0017198 A1 | 1/2010 | Yamanashi et al. | |
| 2010/0063802 A1 | 3/2010 | Gao | |
| 2010/0063812 A1 | 3/2010 | Gao | |
| 2010/0083344 A1 | 4/2010 | Schildbach et al. | |
| 2010/0106494 A1 | 4/2010 | Honma et al. | |
| 2010/0106509 A1 | 4/2010 | Shimada | |
| 2010/0161323 A1 | 6/2010 | Oshikiri | |
| 2010/0179991 A1 | 7/2010 | Lorch et al. | |
| 2010/0198587 A1 | 8/2010 | Ramabadran et al. | |
| 2010/0198588 A1 | 8/2010 | Sudo et al. | |
| 2010/0217607 A1 | 8/2010 | Neuendorf et al. | |
| 2010/0222907 A1 | 9/2010 | Hashimoto | |
| 2010/0226498 A1 | 9/2010 | Kino et al. | |
| 2010/0228541 A1 | 9/2010 | Oshikiri | |
| 2010/0228557 A1 | 9/2010 | Chen et al. | |
| 2010/0241437 A1 | 9/2010 | Taleb et al. | |
| 2010/0280833 A1 | 11/2010 | Yamanashi et al. | |
| 2010/0286990 A1 | 11/2010 | Biswas et al. | |
| 2010/0305956 A1 | 12/2010 | Oh et al. | |
| 2010/0318350 A1 | 12/2010 | Endo et al. | |
| 2011/0046965 A1 | 2/2011 | Taleb et al. | |
| 2011/0054911 A1 | 3/2011 | Baumgarte et al. | |
| 2011/0075855 A1 | 3/2011 | Oh et al. | |
| 2011/0106529 A1 | 5/2011 | Disch | |
| 2011/0112845 A1 | 5/2011 | Jasiuk et al. | |
| 2011/0137643 A1 | 6/2011 | Yamanashi et al. | |
| 2011/0137650 A1 | 6/2011 | Ljolje | |
| 2011/0137659 A1 | 6/2011 | Honma et al. | |
| 2011/0153318 A1 | 6/2011 | Rossello et al. | |
| 2011/0170711 A1 | 7/2011 | Rettelbach et al. | |
| 2011/0173006 A1 | 7/2011 | Nagel et al. | |
| 2011/0178807 A1 | 7/2011 | Yang et al. | |
| 2011/0222630 A1 | 9/2011 | Suzuki et al. | |
| 2011/0264454 A1 | 10/2011 | Ullberg et al. | |
| 2011/0282675 A1 | 11/2011 | Nagel et al. | |
| 2011/0288873 A1* | 11/2011 | Nagel | G10L 19/00 704/500 |
| 2011/0305352 A1 | 12/2011 | Villemoes et al. | |
| 2011/0307248 A1 | 12/2011 | Yamanashi et al. | |
| 2012/0010880 A1 | 1/2012 | Nagel et al. | |
| 2012/0016667 A1 | 1/2012 | Gao | |
| 2012/0016668 A1 | 1/2012 | Gao | |
| 2012/0057711 A1 | 3/2012 | Makino et al. | |
| 2012/0065983 A1 | 3/2012 | Ekstrand et al. | |
| 2012/0226505 A1 | 9/2012 | Lin et al. | |
| 2012/0243526 A1 | 9/2012 | Yamamoto et al. | |
| 2012/0310654 A1 | 12/2012 | Riedmiller et al. | |
| 2012/0328124 A1 | 12/2012 | Kjoerling | |
| 2013/0028427 A1 | 1/2013 | Yamamoto et al. | |
| 2013/0030818 A1 | 1/2013 | Yamamoto et al. | |
| 2013/0044896 A1 | 2/2013 | Ekstrand | |
| 2013/0086010 A1* | 4/2013 | Wenzel | G06F 11/076 707/E17.005 |
| 2013/0094669 A1 | 4/2013 | Kono et al. | |
| 2013/0124214 A1 | 5/2013 | Yamamoto et al. | |
| 2013/0197912 A1 | 8/2013 | Hayakawa et al. | |
| 2013/0202118 A1 | 8/2013 | Yamamoto et al. | |
| 2013/0204607 A1* | 8/2013 | Baker, IV | G10L 25/51 704/235 |
| 2013/0208902 A1 | 8/2013 | Yamamoto et al. | |
| 2013/0218577 A1 | 8/2013 | Taleb et al. | |
| 2013/0226598 A1 | 8/2013 | Laaksonen et al. | |
| 2013/0275142 A1 | 10/2013 | Hatanaka et al. | |
| 2014/0006037 A1 | 1/2014 | Honma et al. | |
| 2014/0044268 A1* | 2/2014 | Herberger | H04R 29/00 381/104 |
| 2014/0046658 A1 | 2/2014 | Grancharov et al. | |
| 2014/0156289 A1 | 6/2014 | Hatanaka et al. | |
| 2014/0172433 A2 | 6/2014 | Honma et al. | |
| 2014/0180682 A1 | 6/2014 | Shi et al. | |
| 2014/0200899 A1 | 7/2014 | Yamamoto et al. | |
| 2014/0200900 A1 | 7/2014 | Yamamoto et al. | |
| 2014/0205101 A1 | 7/2014 | Yamamoto et al. | |
| 2014/0205111 A1 | 7/2014 | Hatanaka et al. | |
| 2014/0211948 A1 | 7/2014 | Hatanaka et al. | |
| 2014/0214432 A1 | 7/2014 | Hatanaka et al. | |
| 2014/0214433 A1 | 7/2014 | Hatanaka et al. | |
| 2014/0222434 A1 | 8/2014 | Nagel et al. | |
| 2014/0226822 A1 | 8/2014 | Endegard et al. | |
| 2015/0051904 A1 | 2/2015 | Kikuiri et al. | |
| 2015/0088528 A1 | 3/2015 | Toguri et al. | |
| 2015/0120307 A1 | 4/2015 | Yamamoto et al. | |
| 2015/0243295 A1 | 8/2015 | Truman et al. | |
| 2016/0012829 A1 | 1/2016 | Yamamoto et al. | |
| 2016/0019911 A1 | 1/2016 | Yamamoto et al. | |
| 2016/0140982 A1 | 5/2016 | Yamamoto et al. | |
| 2016/0225376 A1 | 8/2016 | Honma et al. | |
| 2016/0322057 A1 | 11/2016 | Yamamoto et al. | |
| 2016/0343380 A1 | 11/2016 | Hatanaka et al. | |
| 2017/0011749 A1 | 1/2017 | Kuech et al. | |
| 2017/0076737 A1 | 3/2017 | Yamamoto et al. | |
| 2017/0148452 A1 | 5/2017 | Hatanaka et al. | |
| 2017/0229139 A1 | 8/2017 | Yamamoto et al. | |
| 2017/0236530 A1 | 8/2017 | Yamamoto et al. | |
| 2017/0337928 A1 | 11/2017 | Yamamoto et al. | |
| 2017/0352365 A1 | 12/2017 | Yamamoto et al. | |
| 2018/0197555 A1 | 7/2018 | Yamamoto et al. | |
| 2018/0330746 A1 | 11/2018 | Yamamoto et al. | |
| 2019/0164558 A1 | 5/2019 | Yamamoto et al. | |
| 2019/0180768 A1 | 6/2019 | Yamamoto et al. | |

FOREIGN PATENT DOCUMENTS

| | | |
|---|---|---|
| CN | 1458646 A | 11/2003 |
| CN | 1328707 C | 7/2007 |
| CN | 1992533 A | 7/2007 |
| CN | 101083076 A | 12/2007 |
| CN | 101178898 A | 5/2008 |

(56) References Cited

FOREIGN PATENT DOCUMENTS

| | | |
|---|---|---|
| CN | 101183527 A | 5/2008 |
| CN | 101548318 A | 9/2009 |
| CN | 101853663 A | 10/2010 |
| CN | 101896968 A | 11/2010 |
| EP | 0 702 368 A2 | 3/1996 |
| EP | 0 749 110 B1 | 7/2001 |
| EP | 1 267 328 A2 | 12/2002 |
| EP | 1 744 139 A1 | 1/2007 |
| EP | 1 801 784 A1 | 6/2007 |
| EP | 1 916 652 A1 | 4/2008 |
| EP | 1 921 610 A2 | 5/2008 |
| EP | 1 968 046 A1 | 9/2008 |
| EP | 2 017 830 A1 | 1/2009 |
| EP | 2 019 391 A2 | 1/2009 |
| EP | 2 159 790 A1 | 3/2010 |
| EP | 2 200 026 A1 | 6/2010 |
| EP | 2 209 116 A1 | 7/2010 |
| EP | 2 317 509 A1 | 5/2011 |
| EP | 2 472 512 A1 | 7/2012 |
| JP | H03064800 A | 3/1991 |
| JP | 3-254223 A | 11/1991 |
| JP | 08-008933 A | 1/1996 |
| JP | 08-030295 A | 2/1996 |
| JP | 08-123484 A | 5/1996 |
| JP | 2655485 B2 | 9/1997 |
| JP | 10-020888 A | 1/1998 |
| JP | 11-168622 A | 6/1999 |
| JP | 2001-134287 A1 | 5/2001 |
| JP | 2001-521648 A | 11/2001 |
| JP | 2002-536679 A | 10/2002 |
| JP | 2002-373000 A | 12/2002 |
| JP | 2003-514267 A | 4/2003 |
| JP | 2003-216190 A | 7/2003 |
| JP | 2003-255973 A | 9/2003 |
| JP | 2003-255998 A | 9/2003 |
| JP | 2003-316394 A | 11/2003 |
| JP | 2004-101720 A | 4/2004 |
| JP | 2004-521394 A | 7/2004 |
| JP | 2004-258603 A | 9/2004 |
| JP | 2005-520219 A | 7/2005 |
| JP | 2005-521907 A | 7/2005 |
| JP | 2006-048043 A | 2/2006 |
| JP | 2007-017908 A | 1/2007 |
| JP | 2007-171821 A | 7/2007 |
| JP | 2007-316254 A | 12/2007 |
| JP | 2007-333785 A | 12/2007 |
| JP | 2008-107415 A | 5/2008 |
| JP | 2008-139844 A | 6/2008 |
| JP | 2008-158496 A | 7/2008 |
| JP | 2008-224902 | 9/2008 |
| JP | 2008-261978 A | 10/2008 |
| JP | 2009-116275 A1 | 5/2009 |
| JP | 2009-116371 A | 5/2009 |
| JP | 2009-134260 A | 6/2009 |
| JP | 2010-020251 A | 1/2010 |
| JP | 2010-079275 A | 4/2010 |
| JP | 2010-526331 A | 7/2010 |
| JP | 2010-212760 A | 9/2010 |
| JP | 2011203483 A | 10/2011 |
| JP | 2012-504260 A | 2/2012 |
| JP | 2013-015633 A | 1/2013 |
| JP | 2016-006540 A | 1/2016 |
| KR | 10-2006-0060928 A | 6/2006 |
| KR | 10-2006-0085118 A | 7/2006 |
| KR | 10-2007-0083997 A | 8/2007 |
| KR | 10-2007-0118174 A | 12/2007 |
| KR | 102356012 B1 | 1/2022 |
| RU | 2 426 180 C2 | 8/2011 |
| WO | WO 2003/042979 A2 | 5/2003 |
| WO | WO 2003/083834 A1 | 10/2003 |
| WO | WO 2004/010415 A1 | 1/2004 |
| WO | WO 2004/027368 A1 | 4/2004 |
| WO | WO 2005/111568 A1 | 11/2005 |
| WO | WO 2006/049205 A1 | 5/2006 |
| WO | WO 2006/075563 A1 | 7/2006 |
| WO | WO 2007/037361 A1 | 4/2007 |
| WO | WO 2007/052088 A1 | 5/2007 |
| WO | WO 2007/126015 A1 | 11/2007 |
| WO | WO 2007/129728 A1 | 11/2007 |
| WO | WO 2007/142434 A1 | 12/2007 |
| WO | WO 2009/001874 A1 | 12/2008 |
| WO | WO 2009/004727 A1 | 1/2009 |
| WO | WO 2009/029037 A1 | 3/2009 |
| WO | WO 2009/054393 A | 4/2009 |
| WO | WO 2009/059631 A1 | 5/2009 |
| WO | WO 2009/093466 A1 | 7/2009 |
| WO | WO 2010/003539 A1 | 1/2010 |
| WO | WO 2010/024371 A1 | 3/2010 |
| WO | WO 2010/039441 A1 | 4/2010 |
| WO | WO 2011/043227 A1 | 4/2011 |
| WO | WO 2015/144587 A1 | 10/2015 |

OTHER PUBLICATIONS

U.S. Appl. No. 13/499,559, filed Jun. 11, 2012, Yamamoto et al.
U.S. Appl. No. 13/639,325, filed Oct. 4, 2012, Yamamoto et al.
U.S. Appl. No. 13/639,338, filed Oct. 4, 2012, Yamamoto et al.
U.S. Appl. No. 13/978,175, filed Jul. 3, 2013, Hatanaka et al.
U.S. Appl. No. 14/006,148, filed Sep. 19, 2013, Honma et al.
U.S. Appl. No. 14/104,828, filed Dec. 12, 2013, Shi et al.
U.S. Appl. No. 14/237,990, filed Feb. 10, 2014, Yamamoto et al.
U.S. Appl. No. 14/237,993, filed Feb. 10, 2014, Yamamoto et al.
U.S. Appl. No. 14/238,243, filed Feb. 11, 2014, Hatanaka et al.
U.S. Appl. No. 14/238,265, filed Feb. 11, 2014, Hatanaka et al.
U.S. Appl. No. 14/239,568, filed Feb. 19, 2014, Hatanaka et al.
U.S. Appl. No. 14/239,574, filed Feb. 19, 2014, Hatanaka et al.
U.S. Appl. No. 14/239,797, filed Feb. 20, 2014, Hatanaka et al.
U.S. Appl. No. 14/390,810, filed Oct. 6, 2014, Toguri et al.
U.S. Appl. No. 14/585,974, filed Dec. 30, 2014, Yamamoto et al.
U.S. Appl. No. 14/870,268, filed Sep. 30, 2015, Yamamoto et al.
U.S. Appl. No. 14/917,825, filed Mar. 9, 2016, Honma et al.
U.S. Appl. No. 15/003,960, filed Jan. 22, 2016, Yamamoto et al.
U.S. Appl. No. 15/106,498, filed Jun. 20, 2016, Yamamoto.
U.S. Appl. No. 15/227,024, filed Aug. 3, 2016, Hatanaka et al.
U.S. Appl. No. 15/424,741, filed Feb. 3, 2017, Hatanaka et al.
U.S. Appl. No. 15/581,527, filed Apr. 28, 2017, Yamamoto et al.
U.S. Appl. No. 15/584,447, filed May 2, 2017, Yamamoto et al.
U.S. Appl. No. 16/046,070, filed Jul. 26, 2018, Yamamoto et al.
U.S. Appl. No. 16/276,936, filed Feb. 15, 2019, Yamamoto et al.
U.S. Appl. No. 16/526,215, filed Jul. 30, 2019, Hatanaka et al.
Hiroyuki Honma, et al., "Technical description of Sony proposal for Dynamic Range Control Technology," ISO/IEC JTC1/SC29/WG11 MPEG2013/M31359, Oct. 23, 2013, Geneva, Switzerland.
International Search Report from the Japanese Patent Office in International Application No. PCT/JP2003/07962, dated Aug. 5, 2003 and English translation thereof.
International Search Report from the Japanese Patent Office in International Application No. PCT/JP2006/300112, dated Apr. 11, 2006 and English translation thereof.
International Search Report from the Japanese Patent Office in International Application No. PCT/JP2007/063395, dated Oct. 16, 2007 and English translation thereof.
International Search Report and Written Opinion and English translation thereof dated Dec. 28, 2010 in connection with International Application No. PCT/JP2010/066882.
English Translation of International Search Report from the Japanese Patent Office in Application No. PCT/JP2011/059030 dated Jul. 12, 2011.
International Search Report and Written Opinion and English translation thereof dated Jul. 12, 2011 in connection with Application No. PCT/JP2011/059028.
International Search Report and Written Opinion and English translation thereof dated Jul. 12, 2011 in connection with Application No. PCT/JP2011/059029.
International Search Report and Written Opinion dated Aug. 23, 2011 in connection with International Application No. PCT/JP2011/004260.

(56) References Cited

OTHER PUBLICATIONS

International Search Report from the Japanese Patent Office in International Application No. PCT/JP2011/072957, dated Jan. 10, 2012 and English translation thereof.
International Preliminary Report on Patentability and English translation thereof dated Apr. 19, 2012 in connection with International Application No. PCT/JP2010/066882.
International Search Report and Written Opinion and English translation thereof dated May 1, 2012 in connection with Application No. PCT/JP2012/057530.
International Preliminary Report on Patentability and English translation thereof dated Oct. 26, 2012 in connection with Application No. PCT/JP2011/059028.
International Preliminary Report on Patentability and English translation thereof dated Oct. 26, 2012 in connection with Application No. PCT/JP2011/059029.
International Preliminary Report on Patentability and English translation thereof dated Oct. 26, 2012 in connection with Application No. PCT/JP2011/059030.
International Search Report and Written Opinion and English translation thereof dated Oct. 30, 2012 in connection with Application No. PCT/JP2012/070683.
International Search Report and Written Opinion and English translation thereof dated Oct. 30, 2012 in connection with Application No. PCT/JP2012/070684.
International Search Report and Written Opinion and English translation thereof dated Oct. 30, 2012 in connection with Application No. PCT/JP2012/070682.
European Search Report dated Jan. 18, 2013 in connection with European Application No. 10821898.3.
International Preliminary Report on Patentability dated Feb. 14, 2013 in connection with International Application No. PCT/JP2011/004260.
International Preliminary Report on Patentability and English translation thereof dated Apr. 25, 2013 in connection with International Application No. PCT/JP2011/072957.
International Preliminary Report on Patentability and English translation thereof dated Oct. 10, 2013 in connection with Application No. PCT/JP2012/057530.
Singapore Written Opinion dated Oct. 23, 2013 in connection with Singapore Application No. 201207284-9.
Supplementary European Search Report dated Nov. 6, 2013 in connection with European Application No. 11768824.2.
Supplementary European Search Report dated Nov. 12, 2013 in connection with European Application No. 11768825.9.
Supplementary European Search Report dated Nov. 14, 2013 in connection with European Application No. 11768826.7.
Extended European Search Report from the Europe Patent Office in connection with European Application No. 118142595 dated Dec. 20, 2013 (6 pages).
International Preliminary Report on Patentability and English translation thereof dated Mar. 6, 2014 in connection with Application No. PCT/JP2012/070683.
International Preliminary Report on Patentability and English translation thereof dated Mar. 6, 2014 in connection with Application No. PCT/JP2012/070684.
International Preliminary Report on Patentability and English translation thereof dated Mar. 6, 2014 in connection with Application No. PCT/JP2012/070682.
Chinese Office Action dated Mar. 26, 2014 in connection with Chinese Application No. 201180018932.3 and English translation thereof.
Notification of Reason(s) for Japanese Patent Application No. 2010-174758 dated May 29, 2014 and English translation thereof.
Notification of Reason for Refusal in counterpart Japanese Application No. 2010-232106 dated Jun. 3, 2014 and English translation thereof.
Japanese Office Action dated Aug. 5, 2014 and English translation thereof in connection with Japanese Application No. 2011-072382.
Japanese Office Action dated Aug. 12, 2014 and English translation thereof in connection with Japanese Application No. 2011-072380.
Japanese Office Action dated Oct. 15, 2014 in connection with Japanese Application No. 2010-162259 and English translation thereof.
International Search Report and English translation thereof dated Dec. 9, 2014 in connection with International Application No. PCT/JP2014/073465.
Written Opinion and English translation thereof dated Dec. 9, 2014 in connection with International Application No. PCT/JP2014/073465.
Extended European Search Report dated Feb. 18, 2015 in connection with European Application No. 12765534.8.
Chinese Office Action dated Mar. 3, 2015 in connection with Chinese Application No. 201280014616.3 and English translation thereof.
International Search Report and English translation thereof dated Mar. 17, 2015 in connection with International Application No. PCT/JP2014/082925.
Japanese Office Action mailed Mar. 17, 2015 and English translation thereof in connection with Japanese Application No. 2011-072380.
Written Opinion and English translation thereof dated Mar. 17, 2015 in connection with International Application No. PCT/JP2014/082925.
Extended European Search Report dated Mar. 24, 2015 in connection with EP 12825849.8.
Extended European Search Report dated Mar. 26, 2015 in connection with EP 12826007.2.
Extended European Search Report dated Apr. 15, 2015 in connection with Application No. 12825891.0.
Japanese Office Action dated Jul. 7, 2015 in connection with Japanese Application No. 2014-160284 and English translation thereof.
Japanese Decision to Dismiss the Amendment and English translation thereof dated Oct. 6, 2015 in connection with Japanese Application No. 2010-174758.
Japanese Decision of Refusal and English translation thereof dated Oct. 6, 2015 in connection with Japanese Application No. 2010-174758.
Korean Office Action dated Oct. 8, 2015 and English translation thereof in connection with Korean Application No. 10-2012-7008330.
Chinese Office Action dated Nov. 19, 2015 in connection with Chinese Application No. 201280014616.3 and English translation thereof.
Korean Office Action dated Jan. 11, 2016 and English translation thereof in connection with Korean Application No. 10-2015-7034573.
Korean Office Action dated Jan. 11, 2016 and English translation thereof in connection with Korean Application No. 10-2015-7034574.
Extended European Search Report dated Feb. 5, 2016 in connection with European Application No. 15184417.2.
Japanese Office Action dated Mar. 16, 2016 and English translation thereof in connection with Japanese Application No. 2010-174758.
Extended European Search Report dated Mar. 17, 2016 in connection with European Application No. 11832458.1.
International Preliminary Report on Patentability and English translation thereof dated Mar. 31, 2016 in connection with International Application No. PCT/JP2014/073465.
Chinese Office Action dated May 3, 2016 and English translation thereof in connection with Chinese Application No. 201410208486.8.
Chinese Office Action dated May 5, 2016 and English translation thereof in connection with Chinese Application No. 201410208805.5.
International Preliminary Report on Patentability and English translation thereof dated Jul. 7, 2016 in connection with International Application No. PCT/JP2014/082925.
Korean Office Action dated Jul. 11, 2016 and English translation thereof in connection with Korean Application No. 10-2015-7034573.

(56) References Cited

OTHER PUBLICATIONS

Extended European Search Report dated Sep. 14, 2016 in connection with European Application No. 16171291.4.
Japanese Office Action dated Nov. 8, 2016 in connection with Japanese Office Action No. 2015-174576 and English translation thereof.
Chinese Office Action dated Nov. 16, 2016 in connection with Chinese Application No. 201410374129.9 and English translation thereof.
Japanese Office Action dated Jan. 5, 2017 in connection with Japanese Application No. 2010-174758 and English translation thereof.
Korean Office Action dated Jan. 20, 2017 and English translation thereof in connection with Korean Application No. 10-2016-7032867.
Extended European Search Report dated Apr. 3, 2017 in connection with European Application No. 14846054.6.
Singapore Search Report dated Apr. 18, 2017 in connection with Singapore Application No. 10201500267U.
Korean Office Action dated Apr. 19, 2017 and English translation thereof in connection with Korean Application No. 10-2012-7026063.
Korean Office Action dated Apr. 19, 2017 and English translation thereof in connection with Korean Application No. 10-2012-7026087.
Singapore Written Opinion dated May 23, 2017 in connection with Singapore Application No. 11201605015.X.
Korean Office Action dated May 30, 2017 and English translation thereof in connection with Korean Application No. 10-2012-7007903.
Extended European Search Report dated Jun. 8, 2017 in connection with European Application No. 14873206.8.
Korean Office Action dated Aug. 21, 2017 in connection with Korean Application No. 10-2013-7008804 and English translation thereof.
Extended European Search Report dated Aug. 23, 2017 in connection with European Application No. 17170369.7.
Korean Office Action dated Sep. 20, 2017 in connection with Korean Application No. 10-2012-7026087 and English translation thereof.
Korean Office Action dated Sep. 20, 2017 in connection with Korean Application No. 10-2012-7026063 and English translation thereof.
Korean Office Action dated Feb. 9, 2018 in connection with Korean Application No. 10-2017-7030518 and English translation thereof.
Extended European Search Report dated Feb. 20, 2018 in connection with European Application No. 17210387.1.
Korean Office Action dated May 4, 2018 in connection with Korean Application No. 10-2018-7004221 and English translation thereof.
Japanese Office Action dated Aug. 28, 2018 in connection with Japanese Application No. 2017-140510 and English translation thereof.
Korean Office Action dated Aug. 29, 2018 in connection with Korean Application No. 10-2018-7020930 and English translation thereof.
Korean Office Action dated Nov. 28, 2018 in connection with Korean Application No. 10-2018-7004221, and English translation thereof.
Korean Office Action dated Nov. 28, 2018 in connection with Korean Application No. 10-2018-7005834, and English translation thereof.
Chinese Office Action dated Mar. 4, 2019 and English translation thereof in connection with Chinese Application No. 201480069805.X.
Extended European Search Report dated Oct. 8, 2019 in connection with European Application No. 19188057.4.
Extended European Search Report dated Oct. 23, 2019 in connection with European Application No. 19195708.3.
Extended European Search Report dated Jan. 15, 2020 in connection with European Application No. 19199358.3.
Baumgarte et al., Description of Apple's proposal considering the CfP on Dynamic Range Control Technology, A Dynamic Range Compression Tool for Audio, Motion Picture Expert Group Meeting, ISO/IEC JTC1/SC29/WG1, M31471, Oct. 2013, Geneva, Switzerland, 32 pages.
Baumgarte, F., Enhanced Metadata for Dynamic Range Compression, MPEG Meeting, Apr. 2013, ISO/IEC JTC1/SC29/WG11 MPEG 2013, No. m28901, 10 pages.
Bosi et al., ISO/IEC MPEG-2 Advanced Audio Coding, J. Audio Eng. Soc., vol. 45, No. 10, pp. 789-814.
Chennoukh et al., Speech enhancement via frequency bandwidth extension using line spectral frequencies. IEEE International Conference on Acoustics, Speech and Signal Processing, 2001;1:665-668.
Chinen et al., Report on PVC CE for SBR in USAC, Motion Picture Expert Group Meeting, Oct. 28, 2010, ISO/IEC JTC1/SC29/WG11, No. M18399, 47 pages.
Ekstrand, P., Bandwidth Extension of Audio Signals by Spectral Band Replication, Proc. 1st IEEE Benelux Workshop on Model based Processing and Coding of Audio (MPCA-202), Leuven, Belgium, Nov. 15, 2002, pp. 53-58.
Kjorling et al., Proposed modification of 14496-3:2001/AMD1:2003/Dcor.1. (N6008) concerning SBR and DRC, Motion Picture Expert Group Meeting, ISO/IEC JTC1/SC29/WG11, M10373, Dec. 2003, Hawaii, USA, 7 pages.
Krishnan et al., EVRC-Wideband: The New 3GPP2 Wideband Vocoder Standard, Qualcomm Inc., IEEE International Conference on Acoustics, Speech, and Signal Processing, Apr. 15, 2007, pp. II-333-II-336.
Liu et al., High frequency reconstruction for band-limited audio signals. Proc of the 6th Int'l Conference on Digital Audio Effects, DAX 1-6, London, UK. Sep. 8-11, 2003.
Neugebauer et al., Core Experiment on Low-Bitrate Gain Sequence Coding for MPEG-D DRC, Motion Picture Expert Group Meeting, ISO/IEC JTC1/SC29/WG11, M33145, Mar./Apr. 2014, Valencia Spain, 26 pages.
No Author Listed, Information technology—Coding of audio-visual objects—Part 3: Audio, International Standard, ISO/IEC 14496-3:/Amd.1: 1999(E), ISO/IEC JTC 1/SC 29/WG 11, 199 pages.
No Author Listed, Information technology Coding of audio-visual objects Part 3: Audio, International Standard, ISO/IEC 14496-3:2001(E), Second Edition, Dec. 15, 2001, 110 pages.

\* cited by examiner

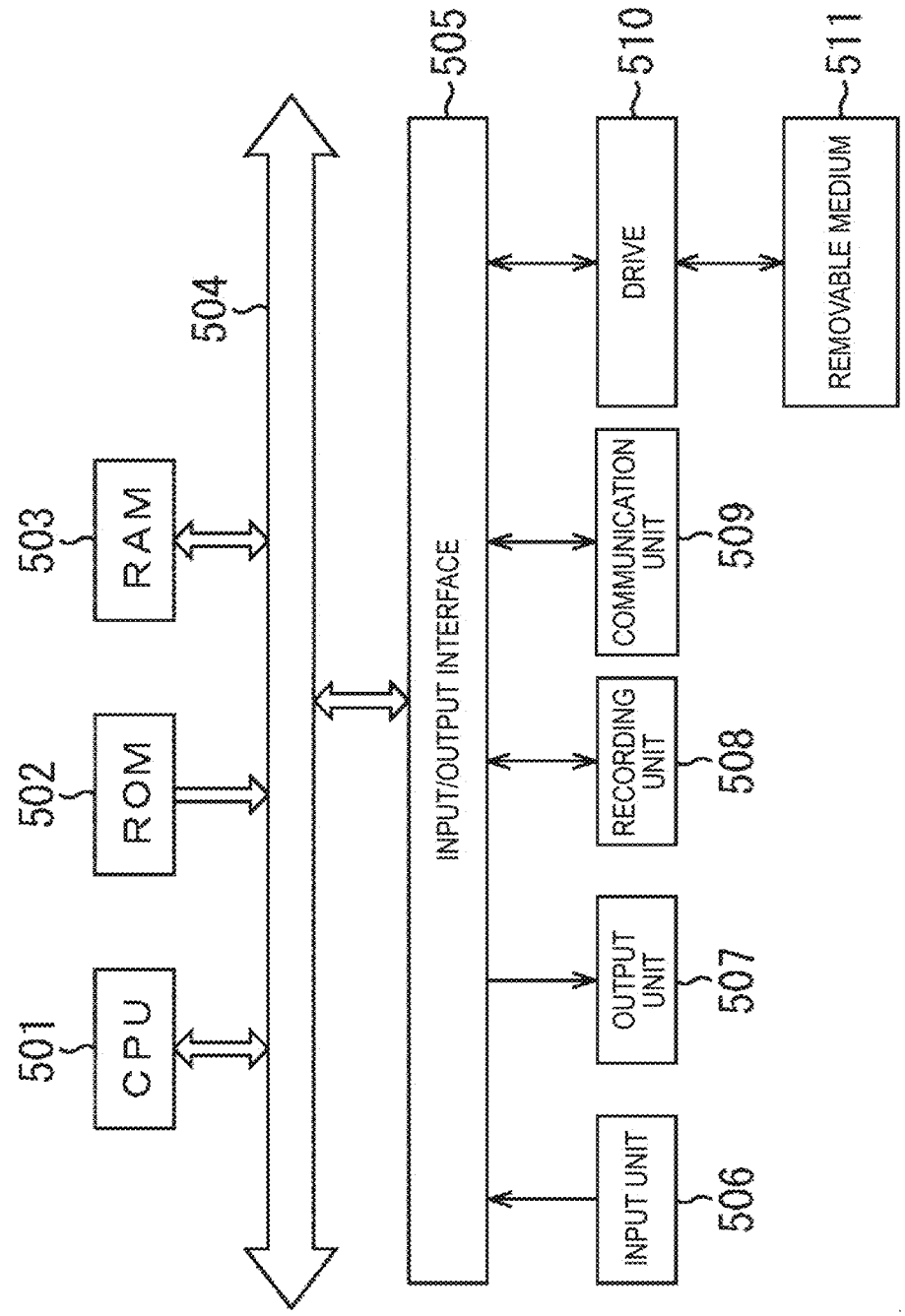

DECODING APPARATUS AND METHOD, AND PROGRAM

CROSS-REFERENCE TO RELATED APPLICATIONS

The present application claims the benefit under 35 U.S.C. § 120 as a continuation application of U.S. application Ser. No. 15/106,498, filed on Jun. 20, 2016, now U.S. Pat. No. 10,692,511, which claims the benefit under 35 U.S.C. § 371 which is a National Stage of International Application No. PCT/JP2014/082925, filed in the Japanese Patent Office as a Receiving office on Dec. 12, 2014, which claims priority to Japanese Patent Application Number 2013-272943, filed in the Japanese Patent Office on Dec. 27, 2013, each of which is hereby incorporated by reference in its entirety.

TECHNICAL FIELD

The present technology relates to a decoding apparatus, a decoding method and a program, and, more particularly, a decoding apparatus, a decoding method and a program which make it possible to obtain sound with higher quality.

BACKGROUND ART

In related art, in an audio coding technique of moving picture experts group (MPEG) advanced audio coding (AAC) (ISO/IEC14496-3:2001), it is possible to record auxiliary information of downmixing or dinamic range compression (DRC) in a bit stream and use the auxiliary information at a reproduction side according to an environment of the reproduction side (see, for example, Non-Patent Literature 1).

Use of such auxiliary information enables an audio signal to be downmixed at the reproduction side or volume to be appropriately controlled through the DRC.

CITATION LIST

Non-Patent Literature

Non-Patent Literature 1: Information technology Coding of audiovisual objects Part 3: Audio (ISO/IEC 14496-3: 2001)

SUMMARY OF INVENTION

Technical Problem

For example, with the above-described coding technique, it is possible to designate DRC gain information for volume control as auxiliary information of DRC in units of a frame of an audio signal, and, at a reproduction side, by correcting volume of the audio signal based on this DRC gain information, it is possible to obtain sound with appropriate volume.

However, a gain indicated by such DRC gain information becomes the same value for each sample within one frame of the audio signal which is a temporal signal. That is, all samples included in one frame are corrected with the same gain.

Therefore, for example, when a magnitude of the gain indicated by the DRC gain information largely changes between frames, portions of temporal waveforms of the audio signal become discontinuous between the frames, which may cause degradation in auditory terms.

The present technology has been made in view of such circumstances, and is directed to making it possible to obtain sound with higher quality.

Solution to Problem

A decoding apparatus according to a first aspect of the present technology includes: a gain readout unit configured to read out encoded gain values at at least two gain sample positions of a time series signal; an interpolation information readout unit configured to read out interpolation information indicating whether the gain value at each sample position of the time series signal is obtained through linear interpolation or obtained through non-linear interpolation; and an interpolation processing unit configured to obtain the gain value at each sample position located between the two gain sample positions of the time series signal based on the gain values at the gain sample positions through linear interpolation or non-linear interpolation according to the interpolation information.

The gain readout unit can be caused to further read out gain inclination values indicating inclination of the gain values at the gain sample positions. When the gain value is obtained through non-linear interpolation, the interpolation processing unit can be caused to obtain the gain value at each sample position located between the two gain sample positions based on the gain values and the gain inclination values at the gain sample positions.

The decoding apparatus can further include: a limiting processing unit configured to perform limiting processing on the gain value obtained through non-linear interpolation so that the gain value becomes a value equal to or greater than a predetermined lower limit or a value equal to or less than a predetermined upper limit.

The limiting processing unit can be caused to perform limiting processing using zero as the lower limit, limiting processing using one as the lower limit or limiting processing using one as the upper limit.

The decoding apparatus can further include: an operation unit configured to obtain at the gain sample positions, straight lines having the gain values at the gain sample positions and having inclination indicated by the gain inclination values at the gain sample positions, and obtain differences between a gain value at an intersection of the straight lines obtained for the two gain sample positions and the gain values at the two gain sample positions. When the interpolation information is information indicating that the gain value is obtained through linear interpolation, the interpolation processing unit can be caused to obtain the gain value through linear interpolation, and, when the interpolation information is information indicating that the gain value is obtained through non-linear interpolation, the interpolation processing unit can be caused to obtain the gain value through non-linear interpolation or linear interpolation according to the differences.

A decoding method or a program according to the first aspect of the present technology includes the steps of: reading out encoded gain values at at least two gain sample positions of a time series signal; reading out interpolation information indicating whether the gain value at each sample position of the time series signal is obtained through linear interpolation or obtained through non-linear interpolation; and obtaining the gain value at each sample position located between the two gain sample positions of the time series signal based on the gain values at the gain sample positions through linear interpolation or non-linear interpolation according to the interpolation information.

According to the first aspect of the present technology, encoded gain values at at least two gain sample positions of a time series signal are read out. Interpolation information indicating whether the gain value at each sample position of the time series signal is obtained through linear interpolation or obtained through non-linear interpolation is read out. The gain value at each sample position located between the two gain sample positions of the time series signal based on the gain values at the gain sample positions is obtained through linear interpolation or non-linear interpolation according to the interpolation information.

A decoding apparatus according to a second aspect of the present technology includes: a gain readout unit configured to read out encoded gain values at at least two gain sample positions of a time series signal and gain inclination values indicating inclination of the gain values; an operation unit configured to obtain at the gain sample positions, straight lines having the gain values at the gain sample positions and having inclination indicated by the gain inclination values at the gain sample positions, and obtain differences between a gain value at an intersection of the straight lines obtained for the two gain sample positions and the gain values at the two gain sample positions; and an interpolation processing unit configured to obtain the gain value at each sample position located between the two gain sample positions of the time series signal through linear interpolation or non-linear interpolation according to the differences.

A decoding method or a program according to the second aspect of the present technology includes the steps of: reading out encoded gain values at at least two gain sample positions of a time series signal and gain inclination values indicating inclination of the gain values; obtaining at the gain sample positions, straight lines having the gain values at the gain sample positions and having inclination indicated by the gain inclination values at the gain sample positions, and obtaining differences between a gain value at an intersection of the straight lines obtained for the two gain sample positions and the gain values at the two gain sample positions; and obtaining the gain value at each sample position located between the two gain sample positions of the time series signal through linear interpolation or non-linear interpolation according to the differences.

According to the second aspect of the present technology, encoded gain values at at least two gain sample positions of a time series signal and gain inclination values indicating inclination of the gain values are read out. At the gain sample positions, straight lines having the gain values at the gain sample positions and having inclination indicated by the gain inclination values at the gain sample positions are obtained and differences between a gain value at an intersection of the straight lines obtained for the two gain sample positions and the gain values at the two gain sample positions are obtained. The gain value at each sample position located between the two gain sample positions of the time series signal is obtained through linear interpolation or non-linear interpolation according to the differences.

Advantageous Effects of Invention

According to the first aspect and the second aspect of the present technology, it is possible to obtain sound with higher quality.

Note that advantageous effects are not limited to the advantageous effect described herein and may be any advantageous effects described in the present disclosure.

BRIEF DESCRIPTION OF DRAWINGS

FIG. 19 is a diagram illustrating a configuration example of a computer according to an embodiment of the present technology.

DESCRIPTION OF EMBODIMENTS

Hereinafter, an embodiment to which the present technology is applied will be described with reference to drawings.

First Embodiment

Outline of the Present Technology

The present technology relates to a technique of encoding a gain value when volume of an audio signal is corrected at a reproduction side, multiplexing a gain code string obtained by encoding the gain value and a signal code string obtained by encoding the audio signal and transmitting the multiplexed code string, and a technique of decoding these gain code string and signal code string and correcting volume of the audio signal.

In the present technology, by designating an arbitrary value for each sample within a frame of the audio signal as a gain value for volume correction, it is possible to obtain sound with a smoother temporal waveform. By this means, it is possible to obtain sound with higher quality which does not cause a feeling of strangeness. Here, while the gain value for volume correction may be a dB value or a linear value, description will be continued below assuming that the gain value is a linear value.

Further, when the gain value is encoded, if a gain code string is obtained by encoding only gain values at part of sample positions such as, for example, characteristic positions such as inflection points of a gain waveform and gain values which are arranged at predetermined intervals among gain values at respective sample positions within a frame, it is also possible to reduce a code amount of the gain code string.

In this case, a decoding side of the gain code string needs to obtain an original gain waveform based on gain values at some sample positions obtained through decoding of the gain code string.

Figure 1:
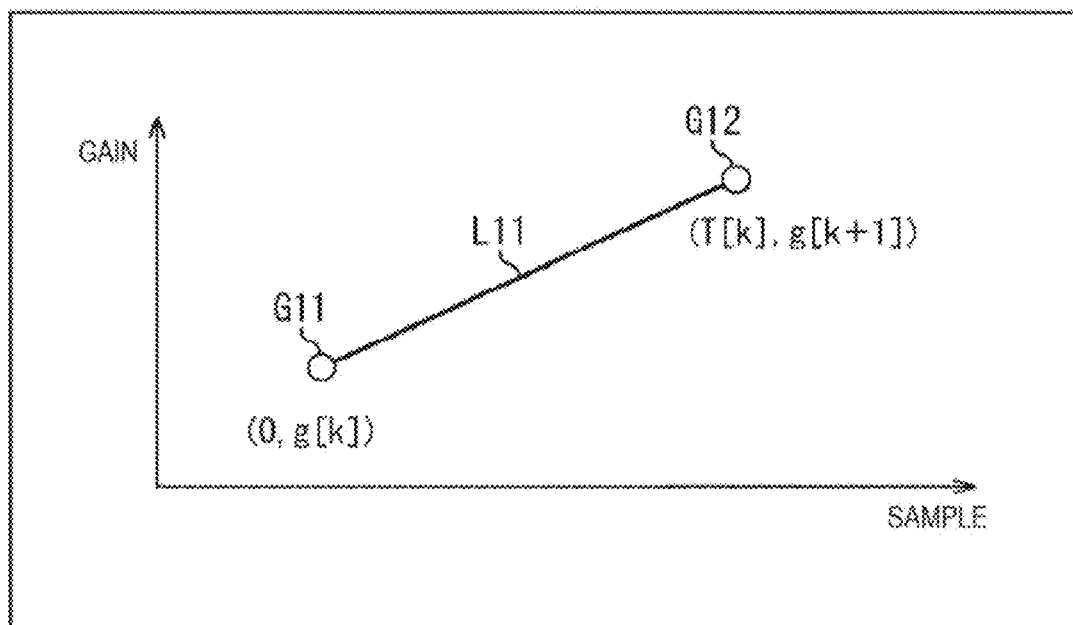
FIG. 1 is a diagram for explaining linear interpolation of a gain according to an embodiment of the present technology.

Here, as a method for obtaining the original gain waveform, for example, there is a possible method for obtaining gain values at sample positions which are not included in the gain code string by performing linear interpolation as illustrated in FIG. 1.

It should be noted that FIG. 1 indicates a gain value on a vertical axis and a sample position within a frame of an audio signal on a horizontal axis.

Further, hereinafter, a sample position of an encoded gain value which is included in a gain code string will be also specially referred to as a gain sample position. Still further, in the following, a point on a gain waveform expressed with an encoded sample position and a gain value included in the gain code string will be also simply referred to as a gain sample position.

In the example of FIG. 1, information of a gain sample position G11 and a gain sample position G12 is obtained through decoding of the gain code string.

Here, a gain value at the k-th gain sample position within a frame is set as g[k], and a sample length (the number of samples) in a sample axis direction from the k-th gain sample position to the k+1-th gain sample position will be expressed as T[k].

In this case, when it is assumed that a sample position of the k-th gain sample position G11 is n=0, the gain sample position G11 is a point expressed with a coordinate (0, g[k]), and the gain sample position G12 is a point expressed with a coordinate (T[k], g[k+1]). Here, n is an index indicating the n-th sample position from the head of the frame.

Further, a gain waveform between the gain sample position G11 and the gain sample position G12 obtained through linear interpolation becomes a waveform indicated with a straight line L11. That is, between the gain sample position G11 and the gain sample position G12, a gain value at each sample position is obtained through interpolation assuming that the gain value linearly changes.

Figure 2:
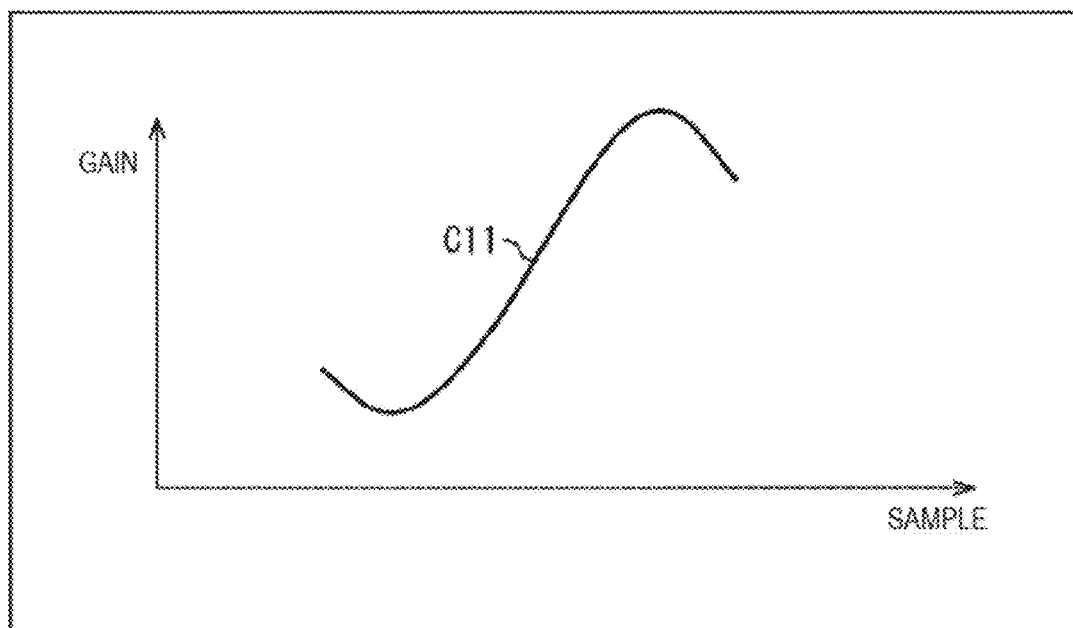
FIG. 2 is a diagram illustrating an example of a gain waveform according to an embodiment of the present technology.

However, if the gain waveform is estimated through linear interpolation, for example, as indicated with a curve C11 in FIG. 2, when a smooth gain waveform is tried to be encoded, the number of points to be encoded in the gain waveform, that is, the number of gain sample positions increases. It should be noted that FIG. 2 indicates a gain value on a vertical axis and a sample position within a frame of an audio signal on a horizontal axis.

In this example, because the gain waveform indicated with the curve C11 is a smooth waveform, if the decoding side tries to reproduce the gain waveform with a certain level of precision, it is necessary to encode gain values at a number of gain sample positions. This will increase a code amount of a bit stream obtained by multiplexing the gain code string and the signal code string, that is, increase a bit rate.

Therefore, in the present technology, in order to make it possible to obtain sound with higher quality with a less code amount, non-linear interpolation is newly performed as appropriate in addition to linear interpolation. That is, a gain waveform is generated by performing interpolation processing using a more appropriate method selected between linear interpolation and non-linear interpolation. It should be noted that non-linear interpolation can be, for example, interpolation using a quadratic function or a cubic function.

Figure 3:
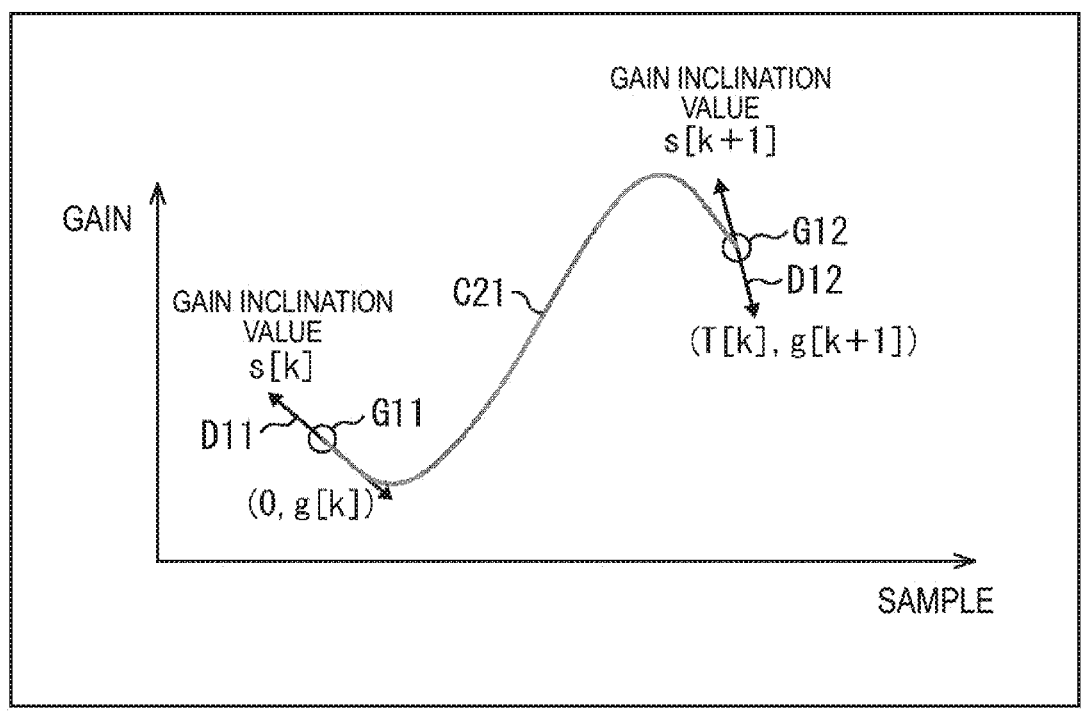
FIG. 3 is a diagram for explaining non-linear interpolation of a gain according to an embodiment of the present technology.

For example, when non-linear interpolation utilizing a cubic function is performed, a waveform indicated with a curve C21 in FIG. 3 can be obtained as a gain waveform between the gain sample position G11 and the gain sample position G12 illustrated in FIG. 1. It should be noted that FIG. 3 indicates a gain value on a vertical axis and a sample position within a frame of an audio signal on a horizontal axis. Further, in FIG. 3, the same reference numerals as those in FIG. 1 are assigned to portions corresponding to those in FIG. 1, and explanation thereof will be omitted as appropriate.

In this example, the gain code string includes information indicating the sample position, the gain value and a gain inclination value at the gain sample position G11, and information indicating the sample position, the gain value and a gain inclination value at the gain sample position G12.

Here, the gain inclination value is information indicating inclination of the original gain waveform at a gain sample position. Hereinafter, a gain inclination value at the k-th gain sample position will be expressed as s[k].

In FIG. 3, an arrow D11 indicates the gain inclination value s[k] at the gain sample position G11, and an arrow D12 indicates a gain inclination value s[k+1] at the gain sample position G12.

At the decoding side, the gain waveform between the gain sample position G11 and the gain sample position G12 is obtained through non-linear interpolation utilizing a cubic function, and, as a result, the gain waveform indicated with the curve C21 is obtained.

The gain waveform indicated with the curve C21 is, for example, a curve of a cubic function which passes through the gain sample position G11 and the gain sample position G12 and whose inclination at the gain sample position G11 and the gain sample position G12 is respectively s[k] and s[k+1].

In this manner, by utilizing non-linear interpolation as appropriate, even when the gain waveform is a smooth waveform, it is possible to reproduce the gain waveform with high precision through encoding of less gain sample positions, that is, with a less code amount.

In the present technology, for example, as a parameter for switching between linear interpolation and non-linear interpolation, interpolation mode information indicating an interpolation scheme using linear interpolation or an interpolation scheme using non-linear interpolation is included in the gain code string. The decoding side switches between linear interpolation and non-linear interpolation according to this interpolation mode information.

Here, the interpolation mode information may be, for example, an index of two bits for switching among linear interpolation, interpolation using a quadratic function and interpolation using a cubic function, or may be a flag of one bit for switching between linear interpolation and interpolation using a cubic function which is non-linear interpolation. That is, any information may be used as the interpolation mode information if the information indicates a method for interpolating a gain waveform.

Further, in the present technology, when the interpolation mode information is information indicating an interpolation scheme using non-linear interpolation, in addition to a gain value, a gain inclination value is included in the gain code string for each gain sample position.

Here, the gain inclination value s[k] indicates change of a gain value per one sample. For example, the gain inclination value s[k] at the k-th gain sample position is inclination of a straight line which connects a point on the gain waveform at the k-th gain sample position and a point on the gain waveform at the next sample position of the k-th gain sample position. It should be noted that the gain inclination value may be obtained using any method if the gain inclination value indicates inclination at the gain sample position on the gain waveform.

It should be noted that the gain inclination value as is may be stored in the gain code string, or a quantization value of the gain inclination value or an entropy encoded value such as a Huffman encoded value of the gain inclination value may be stored in the gain code string.

<Linear Interpolation>

Further, specific examples of a method for performing linear interpolation and a method for performing non-linear interpolation on a gain value at each sample position between two gain sample positions will be described. First, a method for performing linear interpolation will be described.

When linear interpolation is performed using the interpolation mode information, at the decoding side, a gain value is read out for each gain sample position from the gain code string.

Here, an index at the k-th gain sample position is set as k, and a gain value at the k-th gain sample position read out from the gain code string is set as g[k]. Further, a sample length between the k-th gain sample position and the k+1-th gain sample position is set as T[k], and it is assumed that the sample length T[k] is included in the gain code string as information indicating the sample position of the k+1-th gain sample position.

It is now assumed that the k-th gain sample position is a head position of a frame, that is, the sample position of n=0. In such a case, a gain value g_interpolated[n] of the sample n which is located between the k-th gain sample position and the k+1-th gain sample position and which is the n-th (where 0≤n<t[k]) sample from the head is calculated using the following equation (1).

[Math. 1]

$$g\_interpolated[n]=a[k] \times n + b[k]$$

$$(0 \leq n < T[k]) \quad (1)$$

It should be noted that in equation (1), a[k] and b[k] are values respectively obtained using the following equation (2) and equation (3).

[Math. 2]

$$a[k]=(g[k+1]-g[k])/T[k] \quad (2)$$

[Math. 3]

$$b[k]=g[k] \quad (3)$$

That is, a[k] and b[k] indicate inclination and intercept of a straight line connecting the k-th gain sample position and the k+1-th gain sample position. Therefore, in this example, as described with reference to FIG. 1, it is determined that the gain value linearly changes between the k-th gain sample position and the k+1-th gain sample position, and a gain value of each sample n is obtained through linear interpolation.

<Non-Linear Interpolation>

Subsequently, a case will be described where a gain value of the sample n between the k-th gain sample position and the k+1-th gain sample position is obtained through non-linear interpolation. Here, description will be continued with a case where interpolation using a cubic function is performed as an example of non-linear interpolation.

When non-linear interpolation is performed according to the interpolation mode information, at the decoding side, a gain value and a gain inclination value are read out from the gain code string for each gain sample position.

Here, in a similar manner to a case of linear interpolation, a gain value at the k-th gain sample position is set as g[k], and a sample length between the k-th gain sample position and the k+1-th gain sample position is set as T[k]. Further, a gain inclination value at the k-th gain sample position is set as s[k].

It is now assumed that the k-th gain sample position is a head position of the frame, that is, a sample position of n=0. In such a case, a gain value g_interpolated[n] of the sample n which is located between the k-th gain sample position and the k+1-th gain sample position and which is the n-th (where 0≤n<T[k]) sample from the head is calculated using the following equation (4).

[Math. 4]

$$g\_interpolated[n]=c[k] \times n^3 + d[k] \times n^2 + e[k] \times n + f[k]$$

$$(0 \leq n < T[k]) \quad (4)$$

It should be noted that, in equation (4), c[k], d[k], e[k] and f[k] are values respectively obtained using the following equation (5) to equation (8).

[Math. 5]

$$c[k]=(1/T[k]) \times \{(s[k+1]+s[k])/T[k] - 2 \times (g[k+1]-g[k])/(T[k]^2)\} \quad (5)$$

[Math. 6]

$$d[k]=3 \times (g[k+1]-g[k]) - (s[k+1]+2 \times s[k])/T[k] \quad (6)$$

[Math. 7]

$$e[k]=s[k] \quad (7)$$

[Math. 8]

$$f[k]=g[k] \quad (8)$$

In this example, as described with reference to FIG. 3, a gain value of each sample n is obtained through non-linear interpolation, that is, interpolation using a cubic function assuming that the gain value changes according to a cubic function indicated in equation (4) between the k-th gain sample position and the k+1-th gain sample position.

As described above, by obtaining a gain value as appropriate through non-linear interpolation, a smooth gain waveform as illustrated in, for example, FIG. 2 can be encoded at a lower bit rate, so that it is possible to improve coding efficiency.

<Configuration Example of Encoding Apparatus>

Subsequently, a specific embodiment to which the present technology described above is applied will be described.

Figure 4:
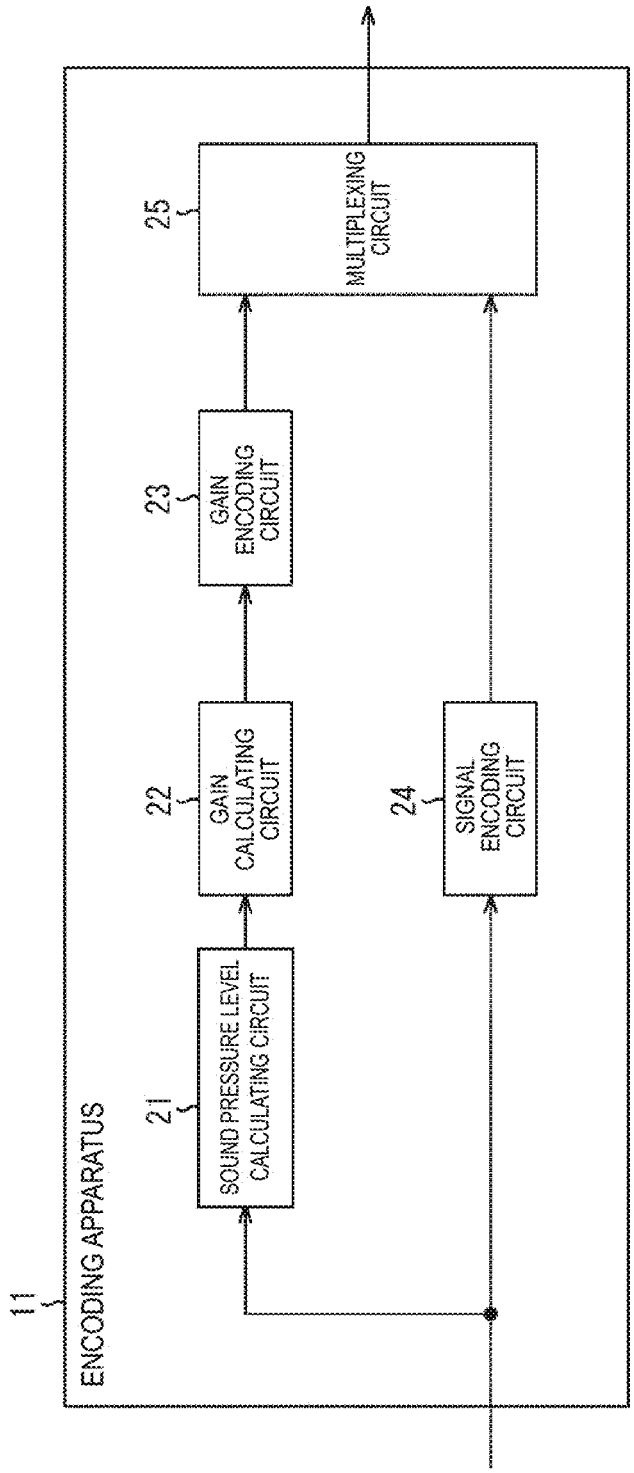
FIG. 4 is a diagram illustrating a configuration example of an encoding apparatus according to an embodiment of the present technology.

FIG. 4 is a diagram illustrating a configuration example of an embodiment of an encoding apparatus to which the present technology is applied.

The encoding apparatus 11 has a sound pressure level calculating circuit 21, a gain calculating circuit 22, a gain encoding circuit 23, a signal encoding circuit 24 and a multiplexing circuit 25.

The sound pressure level calculating circuit 21 calculates sound pressure levels of channels constituting an input time series signal based on the input time series signal which is a supplied multichannel audio signal and obtains a representative value of sound pressure levels for each of the channels as a representative sound pressure level.

It should be noted that the representative value of the sound pressure levels is obtained for each frame of the input time series signal. Further, a frame which is used as a processing unit at the sound pressure level calculating circuit 21 is synchronized with a frame of the input time series signal which is to be processed at the signal encoding circuit 24 which will be described later and is made a frame having a length shorter than that of a frame at the signal encoding circuit 24.

The sound pressure level calculating circuit 21 supplies the obtained representative sound pressure level to the gain calculating circuit 22. The representative sound pressure level obtained in this manner indicates a representative sound pressure level of the channels of the input time series signal which is constituted with an audio signal of the predetermined number of channels such as, for example, 11.1 ch.

The gain calculating circuit 22 calculates a gain value based on the representative sound pressure level supplied from the sound pressure level calculating circuit 21 and supplies the gain value to the gain encoding circuit 23.

Here, the gain value indicates a gain value for correcting volume of the input time series signal so as to be able to obtain sound of appropriate volume when the input time series signal is reproduced at the decoding side, and a gain value is calculated for each sample position within a frame at the gain calculating circuit 22.

The gain encoding circuit 23 encodes the gain value supplied from the gain calculating circuit 22 and supplies a gain code string obtained as a result of encoding to the multiplexing circuit 25.

Here, the gain code string includes gain information for obtaining a gain value of each gain sample position and interpolation mode information.

The signal encoding circuit 24 encodes the supplied input time series signal using a predetermined encoding scheme, for example, a typical encoding method typified by an encoding method using MEPG AAC and supplies a signal code string obtained as a result of encoding to the multiplexing circuit 25.

The multiplexing circuit 25 multiples the gain code string supplied from the gain encoding circuit 23 and the signal code string supplied from the signal encoding circuit 24 and outputs an output code string obtained as a result of multiplexing.

<Description of Encoding Processing>

Specific operation of the encoding apparatus 11 will be described next.

When the input time series signal corresponding to one frame is supplied, the encoding apparatus 11 performs encoding processing of encoding the input time series signal and outputting the output code string. Hereinafter, encoding processing by the encoding apparatus 11 will be described with reference to the flowchart of FIG. 5.

In step S11, the sound pressure level calculating circuit 21 calculates a representative sound pressure level of the input time series signal based on the supplied input time series signal and supplies the representative sound pressure level to the gain calculating circuit 22.

Specifically, the sound pressure level calculating circuit 21 calculates sound pressure levels of respective channels constituting the input time series signal and sets a representative value of the sound pressure levels of these channels as a representative sound pressure level.

For example, in a method for calculating a sound pressure level, a maximum value, a root mean square (RMS), or the like, of frames of an audio signal of channels constituting the input time series signal is used, and a sound pressure level is obtained for each of the channels constituting the input time series signal for the frames of the input time series signal.

Further, as a method for calculating a representative value as the representative sound pressure level, for example, a method in which a maximum value among sound pressure levels of the channels in the same frame is set as the representative value, a method in which one representative value is calculated using a specific calculation formula from the sound pressure levels of the channels, or the like, can be used. Specifically, for example, it is possible to calculate the representative value using a loudness calculation formula described in ITU-R BS.1770-2(03/2011).

In step S12, the gain calculating circuit 22 calculates a gain value based on the representative sound pressure level supplied from the sound pressure level calculating circuit 21 and supplies the gain value to the gain encoding circuit 23.

For example, the gain calculating circuit 22 calculates the gain value according to DRC characteristics designated by a higher-order control apparatus.

Figure 6:
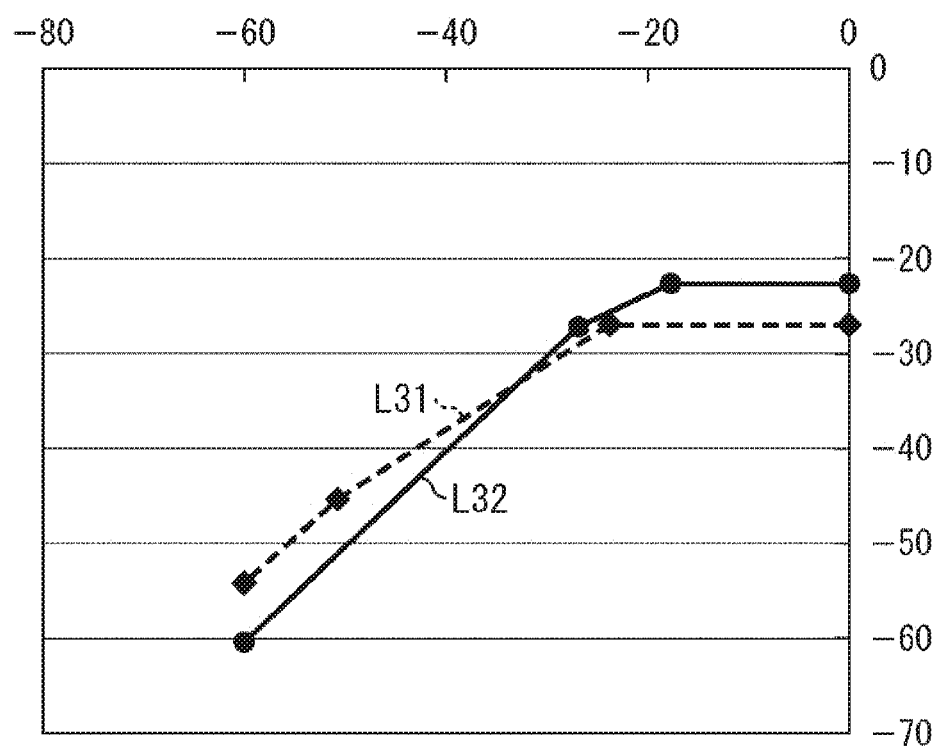
FIG. 6 is a diagram illustrating DRC characteristics according to an embodiment of the present technology.

The DRC characteristics designated by the higher-order control apparatus can be DRC characteristics as illustrated in, for example, FIG. 6. It should be noted that FIG. 6 indicates an input sound pressure level (dBFS), that is, a representative sound pressure level on a horizontal axis, and indicates an output sound pressure level (dBFS), that is, a corrected sound pressure level when the sound pressure level (volume) of the input time series signal is corrected, on a vertical axis.

A broken line L31 and a broken line L32 respectively indicate relationship of the input and output sound pressure levels. For example, according to the DRC characteristic indicated with the broken line L31, when there is an input of the representative sound pressure level of 0 dBFS, volume is corrected so that the sound pressure level of the input time series signal becomes −27 dBFS.

On the other hand, for example, according to the DRC characteristics indicated with the broken line L32, when there is an input of the representative sound pressure level of 0 dBFS, volume is corrected so that the sound pressure level of the input time series signal becomes −21 dBFS.

The gain calculating circuit 22 determines a gain value according to the DRC characteristics indicated with such a broken line L31 and a broken line L32. This gain value is outputted as a gain waveform synchronized with the frame at the signal encoding circuit 24. That is, the gain calculating circuit 22 calculates a gain value for each of samples constituting a frame which is to be processed of the input time series signal.

More specifically, for example, the gain calculating circuit 22 obtains a gain waveform g(J, n) in a frame J by performing calculation of the following equation (9).

[Math. 9]

$$g(J,n)=A\times Gt(J)+(1-A)\times g(J,n-1) \qquad (9)$$

It should be noted that, in equation (9), n indicates a position of a sample which takes values from 0 to N−1 when a frame length is set as N, Gt(J) indicates the above-described DRC characteristics, that is, a target gain in the frame J determined by the input sound pressure level and the output sound pressure level.

Further, A in equation (9) is a value determined by the following equation (10).

[Math. 10]

$$A=1-\exp(-1/(2\times Fs\times Tc(J))) \qquad (10)$$

In equation (10), Fs indicates a sampling frequency (Hz), Tc(J) indicates a time constant in the frame J, and exp(x) indicates an exponent function. Further, in equation (9), a gain value of the last sample in a frame immediately before the frame is used as a gain waveform g(J, n−1) when n=0.

Figure 5:
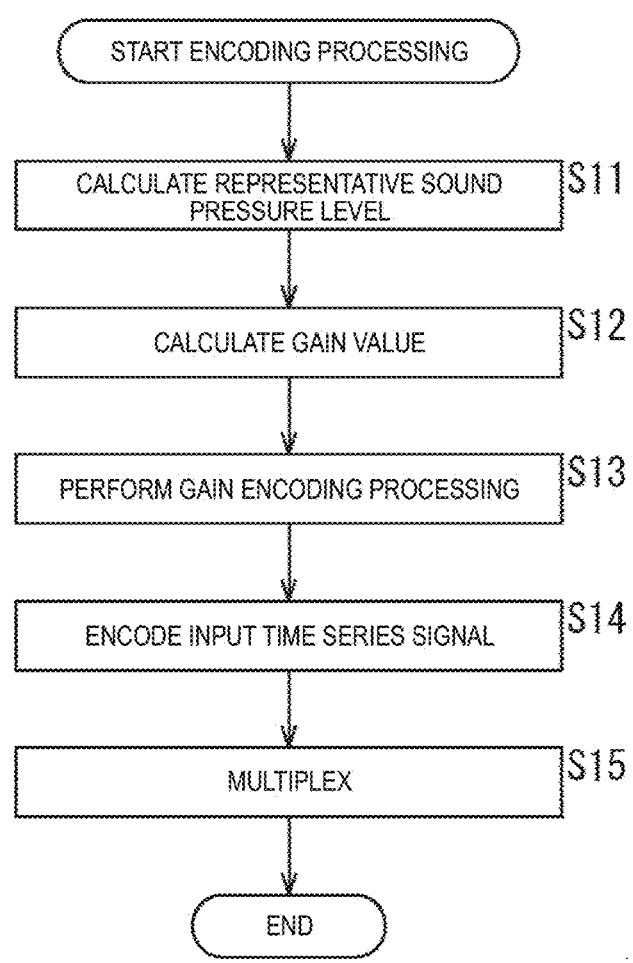
FIG. 5 is a flowchart explaining encoding processing according to an embodiment of the present technology.

Returning to explanation of the flowchart in FIG. 5, in step S13, the gain encoding circuit 23 performs gain encoding processing to encode the gain value supplied from the gain calculating circuit 22. The gain encoding circuit 23 then supplies the gain code string obtained through the gain encoding processing to the multiplexing circuit 25.

For example, the gain encoding circuit 23 extracts a gain sample position to be encoded from the gain value at each sample position supplied from the gain calculating circuit 22, that is, a gain waveform of the frame to be processed. For example, characteristic samples such as inflection points in the gain waveform may be used as the gain sample positions, or samples arranged at predetermined intervals may be used as the gain sample positions.

The gain encoding circuit 23 generates interpolation mode information and gain information for each of the gain sample positions extracted in this manner.

For example, the gain encoding circuit 23 generates the interpolation mode information by performing so-called local decoding.

That is, the gain encoding circuit 23 generates a gain waveform between two gain sample positions adjacent to each other through interpolation for linear interpolation and non-linear interpolation, and calculates a difference between the gain waveform and an actual gain waveform. The gain encoding circuit 23 then generates information indicating an interpolation scheme in which the obtained difference is smaller as the interpolation mode information.

It should be noted that whether linear interpolation is performed or non-linear interpolation is performed may be determined using any other method. For example, it is also possible to determine that linear interpolation is performed when the gain value is the same between the gain sample position to be processed and the gain sample position immediately before the gain sample position to be processed, and the gain inclination value of the gain sample position immediately before the gain sample position to be processed is 0, and, that non-linear interpolation is performed in other cases. Alternatively, it is also possible to employ a configuration where a higher-order control apparatus designates linear interpolation or non-linear interpolation.

Further, the gain encoding circuit 23 encodes a sample length T[k], a gain value g[k] and a gain inclination value s[k] indicating the sample position as appropriate for each gain sample position to obtain gain information. It should be noted that, when the interpolation mode information is information indicating an interpolation scheme using linear interpolation, gain information only including the sample length and the gain value and not including the gain inclination value is generated.

The gain encoding circuit 23 supplies the gain code string including the gain information of each gain sample position and the interpolation mode information obtained in this manner to the multiplexing circuit 25.

In step S14, the signal encoding circuit 24 encodes the supplied input time series signal according to a predetermined encoding scheme and supplies the signal code string obtained as a result of encoding to the multiplexing circuit 25.

In step S15, the multiplexing circuit 25 multiplexes the gain code string supplied from the gain encoding circuit 23 and the signal code string supplied from the signal encoding circuit 24 and outputs the output code string obtained as a result of multiplexing. When the output code string corresponding to one frame is outputted as a bit stream in this manner, encoding processing ends. Then, encoding processing of the next frame is performed.

As described above, the encoding apparatus 11 obtains the gain value for each sample within a frame of the input time series signal to extract the gain sample position and generates the gain code string constituted with gain information of each gain sample position and interpolation mode information.

By the gain value for each sample within a frame being determined in this manner, at the decoding side, temporal waveforms between frames of the audio signal are smoothly connected, so that it is possible to obtain sound with higher quality. Moreover, by the interpolation mode information being included in the gain code string, it is possible to reproduce a gain waveform with high precision with a less code amount by utilizing non-linear interpolation as appropriate.

<Configuration Example of Decoding Apparatus>

A decoding apparatus which receives the output code string outputted from the encoding apparatus 11 as an input code string and decodes the input code string will be described next.

Figure 7:
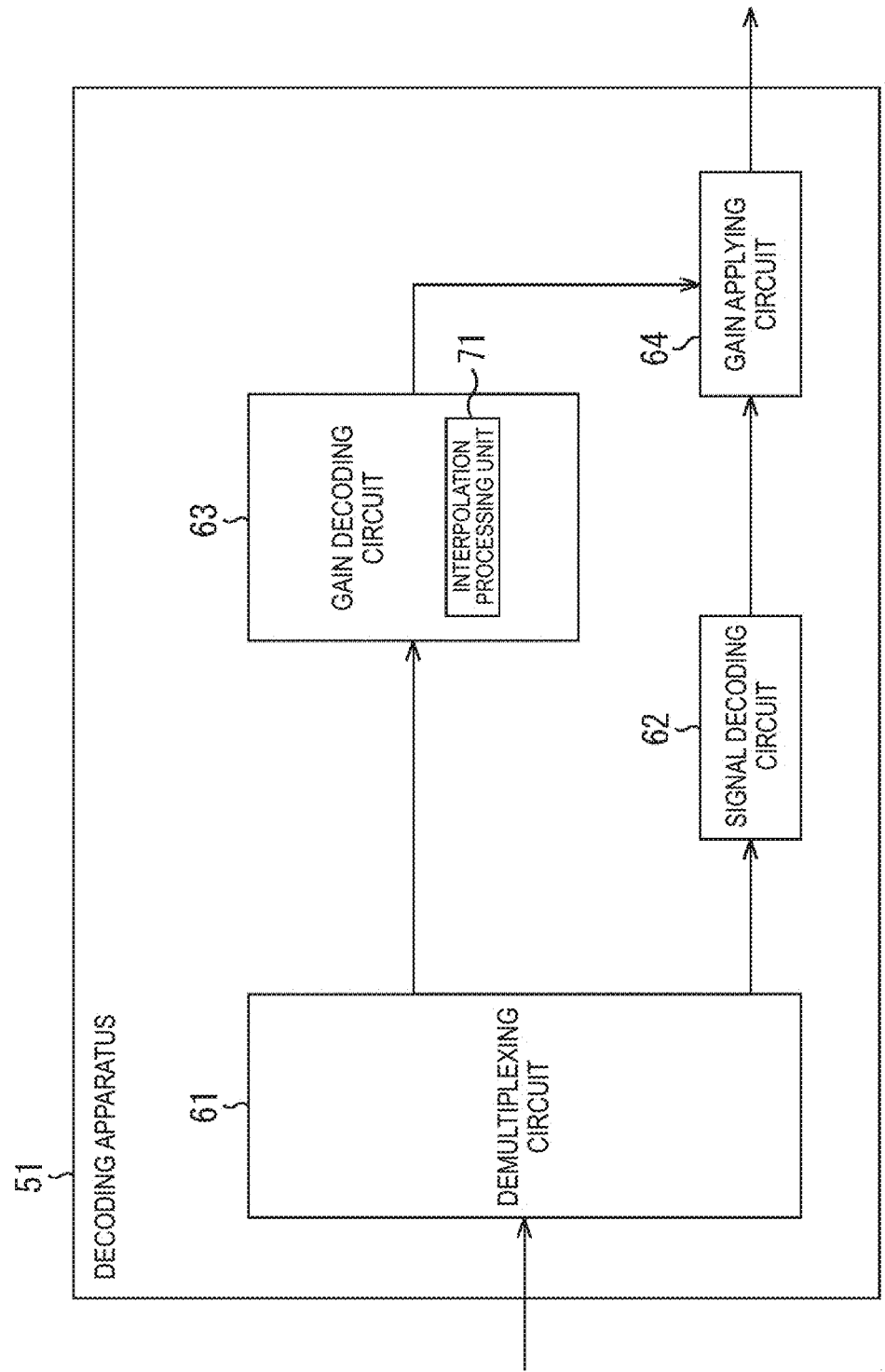
FIG. 7 is a diagram illustrating a configuration example of a decoding apparatus according to an embodiment of the present technology.

FIG. 7 is a diagram illustrating a configuration example of an embodiment of the decoding apparatus to which the present technology is applied.

The decoding apparatus 51 illustrated in FIG. 7 has a demultiplexing circuit 61, a signal decoding circuit 62, a gain decoding circuit 63 and a gain applying circuit 64.

The demultiplexing circuit 61 demultiplexes the supplied input code string, that is, the output code string received from the encoding apparatus 11 and supplies the signal code string obtained as a result of demultiplexing to the signal decoding circuit 62, while supplying the gain code string to the gain decoding circuit 63.

The signal decoding circuit 62 decodes the signal code string supplied from the demultiplexing circuit 61 and supplies a time series signal obtained as a result of decoding to the gain applying circuit 64. Here, the time series signal is, for example, an audio signal of 11.1 ch or 7.1 ch, and an audio signal of channels constituting the time series signal is set as a pulse code modulation (PCM) signal.

The gain decoding circuit 63 decodes the gain code string supplied from the demultiplexing circuit 61 and supplies a gain value obtained as a result of decoding to the gain applying circuit 64. The gain decoding circuit 63 has an interpolation processing unit 71, which calculates a gain value at each sample position of the time series signal through linear interpolation or non-linear interpolation based on the gain information and the interpolation mode information obtained from the gain code string.

The gain applying circuit 64 corrects volume of the time series signal by adjusting a gain of the time series signal supplied from the signal decoding circuit 62 based on the gain value supplied from the gain decoding circuit 63 and outputs an output time series signal obtained as a result of volume correction.

<Explanation of Decoding Processing>

Subsequently, operation of the decoding apparatus 51 will be described.

When the input code string corresponding to one frame is supplied, the decoding apparatus 51 performs decoding processing of decoding the input code string and outputting an output time series signal. The decoding processing by the decoding apparatus 51 will be described below with reference to the flowchart of FIG. 8.

In step S41, the demultiplexing circuit 61 receives the input code string transmitted from the encoding apparatus 11 and demultiplexes the input code string, and supplies a signal code string obtained as a result of demultiplexing to the signal decoding circuit 62, while supplying the gain code string to the gain decoding circuit 63.

In step S42, the signal decoding circuit 62 decodes the signal code string supplied from the demultiplexing circuit 61 and supplies a time series signal obtained as a result of decoding to the gain applying circuit 64.

In step S43, the gain decoding circuit 63 performs gain decoding processing to decode the gain code string supplied from the demultiplexing circuit 61 and supplies a gain value at each sample position of a frame to be processed obtained as a result of decoding to the gain applying circuit 64. It should be noted that details of the gain decoding processing will be described later.

In step S44, the gain applying circuit 64 adjusts a gain of the time series signal supplied from the signal decoding circuit 62 based on the gain value supplied from the gain decoding circuit 63 and outputs the obtained output time series signal. That is, each sample of the time series signal is multiplied by the gain value to be made an output time series signal with appropriate volume.

When the output time series signal is outputted, the decoding processing ends.

As described above, the decoding apparatus 51 decodes the gain code string, and applies the obtained gain value at each sample position to the time series signal to adjust a gain (volume) in a time domain. By adjusting a gain with a gain value determined for each sample position in this manner, it is possible to smoothly connect time waveforms between frames of the output time series signal, so that it is possible to obtain sound with higher quality.

Moreover, because a gain waveform is obtained by utilizing non-linear interpolation as appropriate, even when the gain waveform is a smooth waveform, it is possible to reproduce the gain waveform with high precision with a less code amount.

<Explanation of Gain Decoding Processing>

Further, gain decoding processing corresponding to processing in step S43 of FIG. 8 will be described with reference to the flowchart of FIG. 9.

In step S71, the gain decoding circuit 63 reads out gain information at a gain sample position to be processed from the gain code string supplied from the demultiplexing circuit 61 and decodes a sample length T[k], a gain value g[k] and a gain inclination value s[k] included as the gain information as necessary. It should be noted that when an interpolation scheme indicated by the interpolation mode information is an interpolation scheme using linear interpolation, the gain inclination value is not included in the gain information.

For example, in the gain code string, gain information and interpolation mode information at each gain sample position are stored while being arranged in ascending order of a distance from the head of the frame. Because the gain decoding circuit 63 sequentially reads out the gain information and the interpolation mode information from the gain code string, a gain sample position is set as a gain sample position to be processed in ascending order of a distance from the head of the frame.

In step S72, the gain decoding circuit 63 reads out the interpolation mode information at the gain sample position to be processed from the gain code string.

It should be noted that while an example where the interpolation mode information is included in the gain code string will be described here, the interpolation mode information may be included in a header, or the like, of a bit stream in which an input code string of each frame is included, or the interpolation mode information may be acquired from a higher-order control apparatus, or the like.

In step S73, the interpolation processing unit 71 determines whether or not the interpolation scheme indicated by the read-out interpolation mode information is a scheme using linear interpolation.

In step S73, when it is determined that the interpolation scheme is a scheme using linear interpolation, in step S74, the interpolation processing unit 71 performs linear interpolation to generate a gain waveform.

Specifically, the interpolation processing unit 71 performs the same calculation as that of the above-described equation (1) based on the gain value g[k] and the sample length T[k−1] at the gain sample position to be processed, and a gain value and a sample position at a gain sample position one position closer to the head of the frame from the gain sample position to be processed to generate a gain waveform between the gain sample positions. That is, a gain value at each sample position located between two gain sample positions of the time series signal is calculated, and a waveform constituted with gain values at the sample positions is set as a gain waveform.

When the gain waveform between two adjacent gain sample positions is obtained in this manner, the processing proceeds to step S76.

On the other hand, when it is determined in step S73 that the scheme is a scheme which does not use linear interpolation, that is, a scheme using non-linear interpolation, in step S75, the interpolation processing unit 71 performs non-linear interpolation to generate a gain waveform.

Specifically, the interpolation processing unit 71 performs the same calculation as that of the above-described equation (4) based on the gain value g[k], the sample length T[k−1] and the gain inclination value s[k] at the gain sample position to be processed and a gain value, a sample position and a gain inclination value at a gain sample position one position closer to the head of the frame from the gain sample position to be processed to generate a gain waveform between the gain sample positions. That is, a gain value at each sample position located between two gain sample positions of the time series signal is calculated, and a waveform constituted with gain values of the sample positions is set as a gain waveform.

When the gain waveform between two adjacent gain sample positions is obtained in this manner, the processing proceeds to step S76.

When the gain waveform between the gain sample positions is obtained through interpolation in step S74 or step S75, in step S76, the gain decoding circuit 63 determines whether or not processing is performed for all the gain sample positions.

When it is determined in step S76 that not all of the gain sample positions are processed yet, the processing returns to step S71, and the above-described processing is repeated. That is, the next gain sample position is selected as a processing target, and a gain waveform is obtained through interpolation.

On the other hand, when it is determined in step S76 that all of the gain sample positions are processed, the gain decoding circuit 63 supplies a gain waveform corresponding to one frame constituted with gain values at the sample positions obtained through the processing so far to the gain applying circuit 64, and the gain decoding processing ends. When the gain decoding processing ends, then, the processing proceeds to step S44 in FIG. 8.

The decoding apparatus 51 obtains a gain waveform through linear interpolation or non-linear interpolation according to the interpolation mode information as described above. By obtaining a gain waveform through non-linear interpolation as appropriate according to the interpolation mode information in this manner, it is possible to reproduce a gain waveform with high precision with a less code amount.

It should be noted that while an example has been described above where the interpolation mode information is generated for each gain sample position, and the interpolation scheme is switched between linear interpolation and non-linear interpolation, one piece of the interpolation mode information may be generated for each frame. In this case, the interpolation scheme is switched between linear interpolation and non-linear interpolation in units of a frame.

Further, the interpolation scheme may be switched between linear interpolation and non-linear interpolation in units of a plurality of frames or in units of a file. For example, when the interpolation scheme is switched in units of a file, for example, one piece of interpolation mode information is stored in a header of the bit stream. The interpolation processing unit 71 performs interpolation processing of each frame using an interpolation scheme indicated by the interpolation mode information, that is, either the scheme using linear interpolation or the scheme using non-linear interpolation to obtain a gain waveform corresponding to one file.

Second Embodiment

<Limiting>

By the way, the gain waveform obtained through non-linear interpolation is different from the gain waveform obtained through linear interpolation, and there is a case where a gain value at a sample position between two gain sample positions may be greater or smaller than gain values at two gain sample positions included in the gain code string.

For example, in the example illustrated in FIG. 3, in part of the gain waveform indicated with the curve C21, which is obtained through non-linear interpolation, there is a portion where the gain value becomes smaller than the gain value g[k] at the gain sample position G11. Further, in part of the gain waveform indicated with the curve C21, there is also a portion where the gain value becomes greater than the gain value g[k+1] at the gain sample position G12.

Therefore, there is a case where the gain value obtained through non-linear interpolation becomes a negative (minus) value which is inappropriate as the gain value. Therefore, in order to prevent the gain value obtained through interpolation from becoming an inappropriate value, it is also possible to perform limiting on the gain value using zero as a lower limit by performing calculation of the following equation (11).

[Math. 11]

$$g\_interpolated[n]=\max(0,g\_interpolated[n]) \quad (11)$$

In equation (11), between the gain value g_interpolated[n] obtained through interpolation and zero, a greater one is made a final gain value g_interoplated[n]. Accordingly, the final gain value is equal to or greater than zero, and the gain value does not become a negative value.

Further, there is a case where it is desired to boost (amplify) the time series signal and a case where it is desired to compress (suppress) the time series signal through gain adjustment (volume correction).

For example, when it is desired to boost the time series signal, if the gain value is smaller than one, the gain value becomes an inappropriate value. Therefore, when the time series signal is boosted, it is also possible to perform limiting on the gain value using one as a lower limit by performing calculation of the following equation (12).

[Math. 12]

$$g\_interpolated[n]=\max(1,g\_interpolated[n]) \quad (12)$$

In equation (12), between the gain value g_interpolated[n] obtained through interpolation and one, a greater one is made a final gain value g_interpolated[n]. Accordingly, the gain value does not become a value less than one. In other words, the gain value is always equal to or greater than one which is the lower limit.

Further, for example, when it is desired to compress the time series signal, if the gain value is greater than one, the gain value becomes an inappropriate value. Therefore, when the time series signal is compressed, it is also possible to perform limiting on the gain value using one as an upper limit by performing calculation of the following equation (13).

[Math. 13]

$$g\_interpolated[n]=\min(1,g\_interpolated[n]) \quad (13)$$

In equation (13), between the gain value g_interpolated[n] obtained through interpolation and one, a smaller one is made a final gain value g_interpolated[n]. Accordingly, the gain value does not become a value greater than one. In other words, the gain value is always equal to or smaller than one which is the upper limit.

When limiting processing as indicated in equation (12) or equation (13) is performed, it is only necessary to provide limiting information indicating whether the gain waveform is used for boosting or used for compression to the gain decoding circuit 63 as information regarding the encoded gain waveform. For example, the limiting information may be supplied from a higher-order control apparatus to the gain decoding circuit 63, or the limiting information may be included in the gain code string, the header of the bit stream, or the like.

In the following, description will be continued assuming that the limiting information is included in the gain code string. In this case, in the processing of step S13 in FIG. 15, the gain code string including the limiting information is generated.

By performing the limiting processing on the gain value as described above, it is possible to obtain a more appropriate gain value. By this means, it is possible to perform more appropriate gain adjustment (volume control), and, as a result, it is possible to obtain sound with higher quality.

<Configuration Example of Decoding Apparatus>

Figure 10:
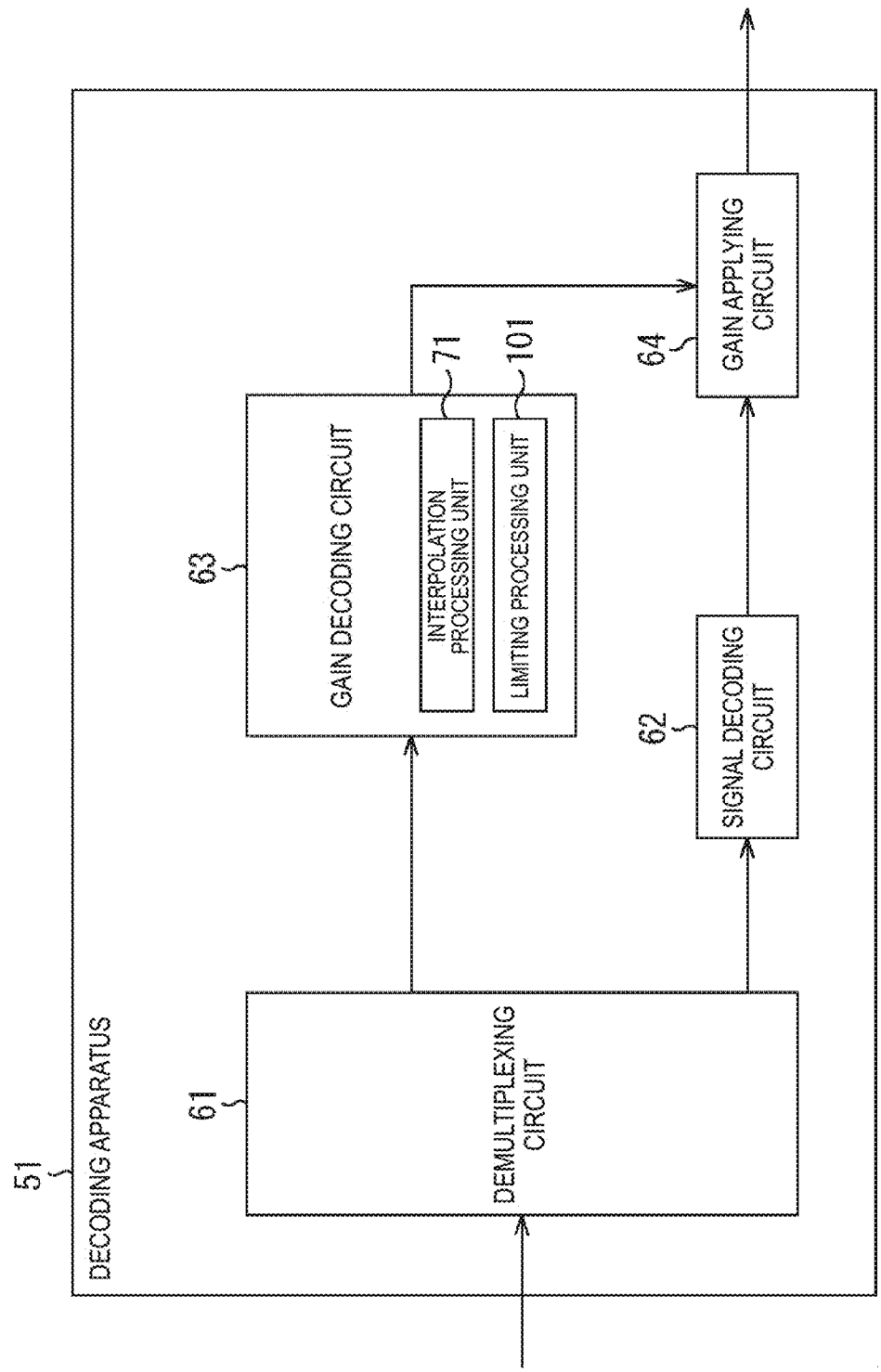
FIG. 10 is a diagram illustrating a configuration example of a decoding apparatus according to an embodiment of the present technology.

When limiting processing is performed on the gain value, the decoding apparatus 51 is configured as illustrated in, for example, FIG. 10. It should be noted that, in FIG. 10, the same reference numerals as those in FIG. 7 are assigned to portions corresponding to those in FIG. 7, and explanation thereof will be omitted as appropriate.

The decoding apparatus 51 illustrated in FIG. 10 has a different configuration from that of the decoding apparatus 51 in FIG. 7 in that a limiting processing unit 101 is newly provided at the gain decoding circuit 63, and has the same configuration as that of the decoding apparatus 51 in FIG. 7 in other points.

The limiting processing unit 101 performs limiting processing on the gain value calculated through non-linear interpolation performed by the interpolation processing unit 71 to obtain a final gain value.

<Explanation of Gain Decoding Processing>

Gain decoding processing performed in the case where the decoding apparatus 51 has the configuration illustrated in FIG. 10 will be described next.

Figure 8:
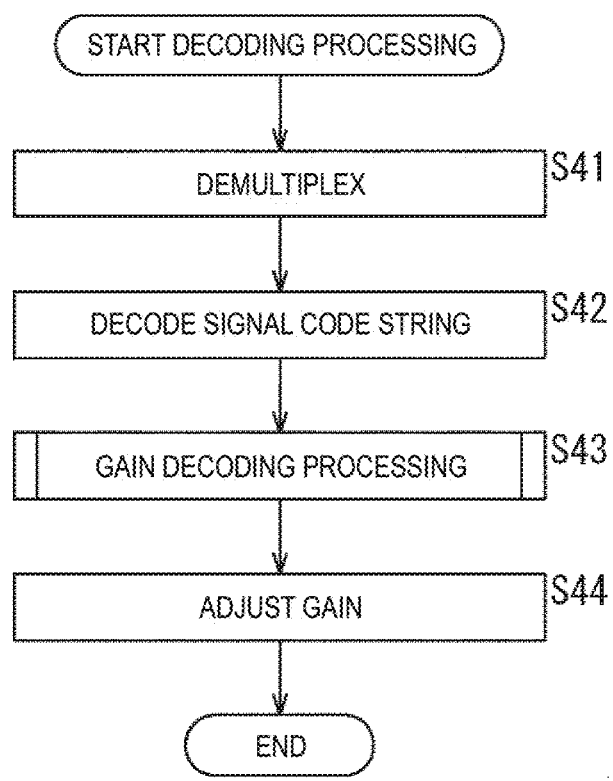
FIG. 8 is a flowchart explaining decoding processing according to an embodiment of the present technology.
Figure 11:
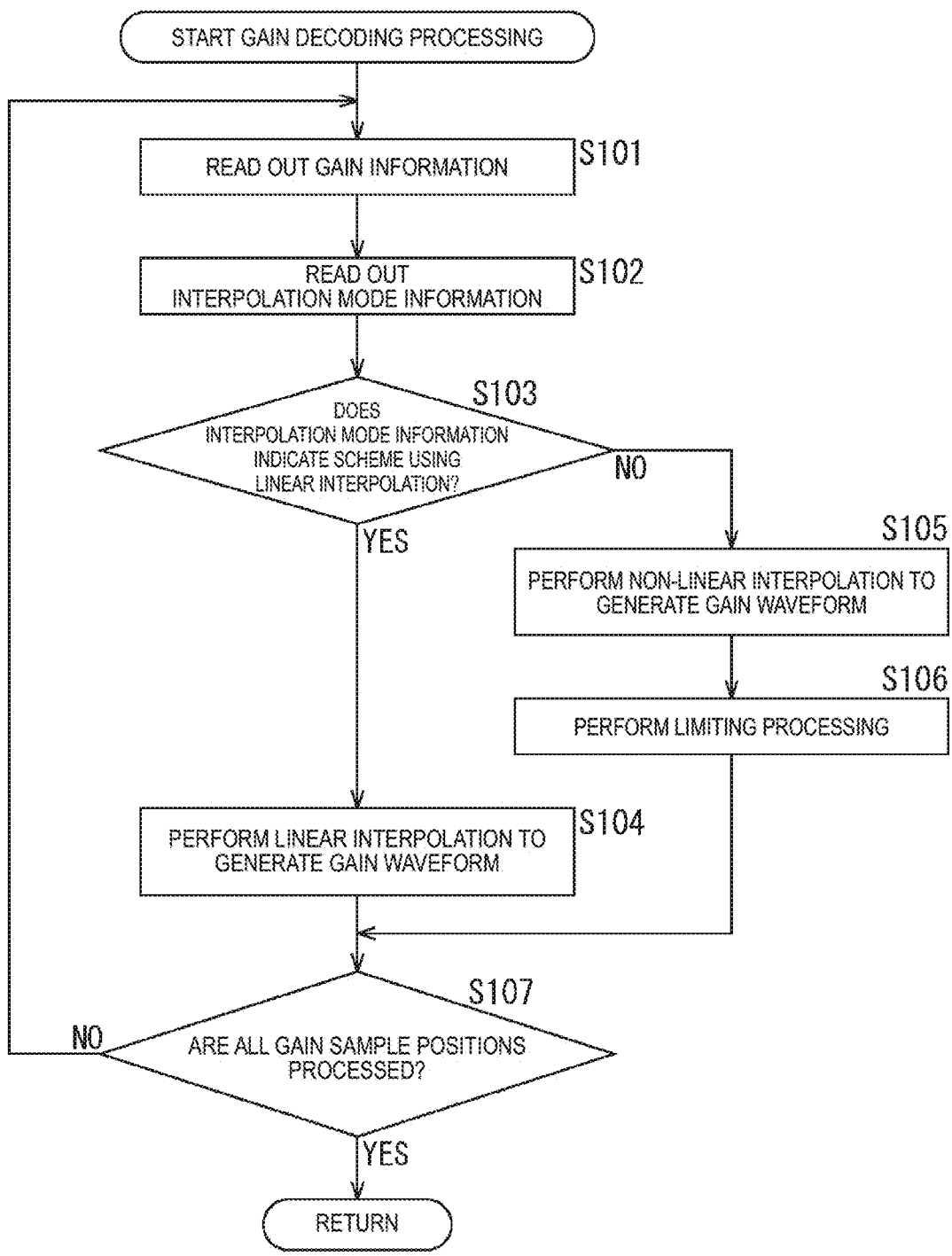
FIG. 11 is a flowchart explaining gain decoding processing according to an embodiment of the present technology.

For example, at the decoding apparatus 51, the decoding processing described with reference to FIG. 8 is performed. However, in gain decoding processing corresponding to step S43, the gain decoding processing illustrated in FIG. 11 is performed. The gain decoding processing by the decoding apparatus 51 in FIG. 10 will be described below with reference to the flowchart of FIG. 11.

Figure 9:
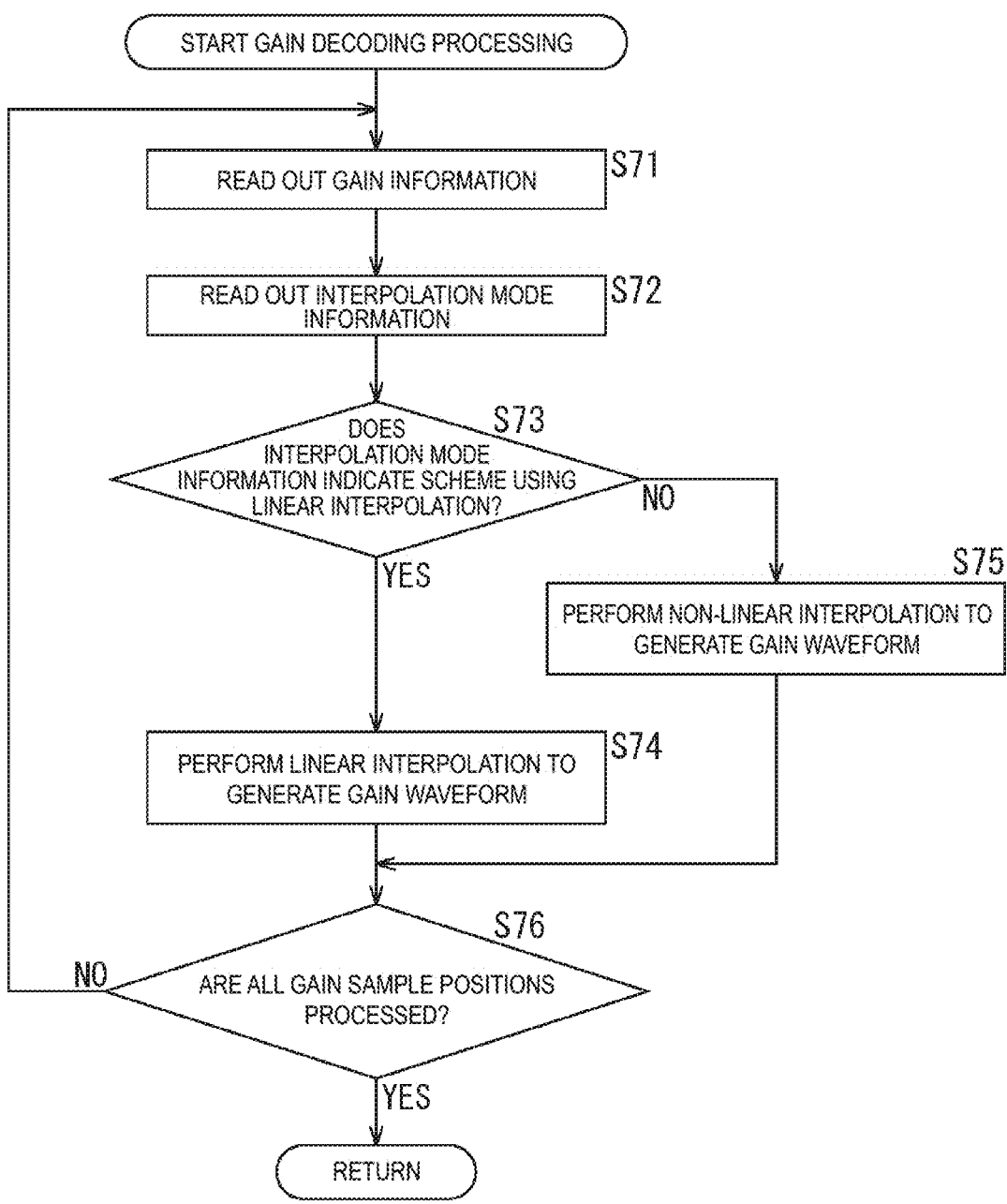
FIG. 9 is a flowchart explaining gain decoding processing according to an embodiment of the present technology.

It should be noted that the processing from step S101 to step S105 is the same as processing from step S71 to step S75 in FIG. 9, explanation thereof will be omitted.

In step S106, the limiting processing unit 101 changes the gain value as appropriate so that the gain value does not become a negative value by performing calculation of the above-described equation (11) on the gain value at each sample position obtained through processing in step S105.

Further, the limiting processing unit 101 obtains a final gain value by further performing calculation of either equation (12) or equation (13) on the gain value limited through calculation of equation (11) according to the limiting information included in the gain code string.

Specifically, when the limiting information included in the gain code string indicates that the gain waveform is to be used for boosting, the limiting processing unit 101 performs calculation of equation (12) so that the gain value does not become a value less than one.

On the other hand, when the limiting information included in the gain code string indicates that the gain waveform is to be used for compression, the limiting processing unit 101 performs calculation of equation (13) so that the gain value does not become a value greater than one.

When the gain waveform is generated through linear interpolation in step S104 or limiting processing is performed in step S106, the processing in step S107 is performed, and the gain decoding processing ends. Because the processing in step S107 is the same as the processing in step S76 in FIG. 9, explanation thereof will be omitted.

As described above, the decoding apparatus 51 performs limiting processing on the gain value obtained through non-linear interpolation. By this means, it is possible to perform gain adjustment (volume correction) with a more appropriate gain value. It is therefore possible to obtain sound with higher quality.

Third Embodiment

<Interpolation of Gain Value>

Further, while, in the above description, an example has been described where the gain waveform is obtained while the interpolation scheme for interpolating the gain value is switched between linear interpolation and non-linear interpolation for each gain sample position, it is also possible to employ a configuration where non-linear interpolation is basically performed, and linear interpolation is performed only under specific conditions.

Figure 12:
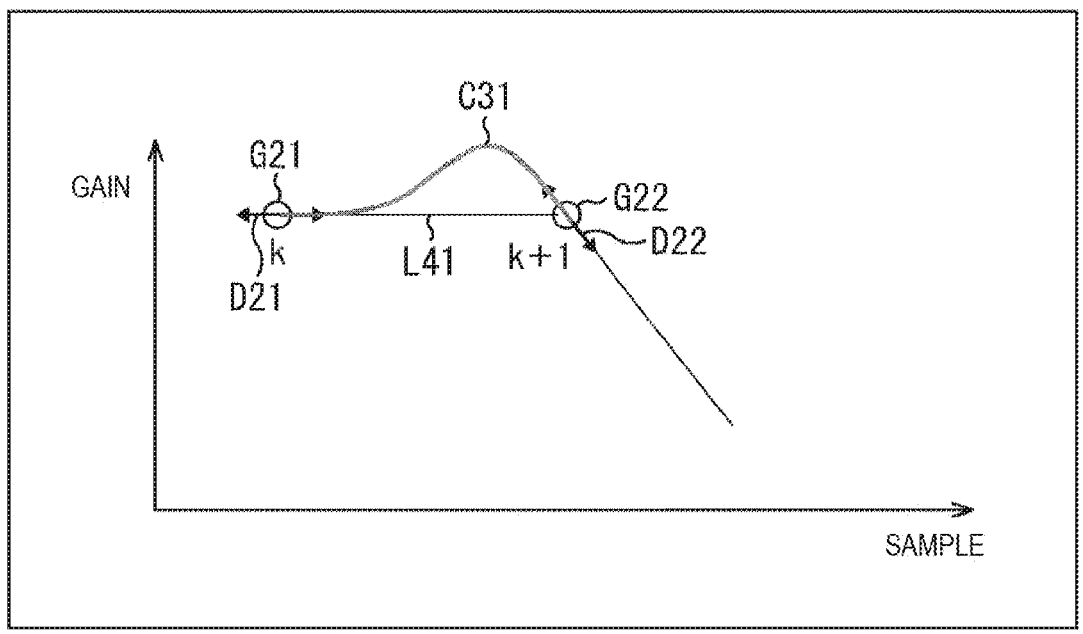
FIG. 12 is a diagram for explaining interpolation of a gain waveform according to an embodiment of the present technology.

For example, a case will be studied where the gain waveform indicated with a broken line L41 illustrated in FIG. 12 is encoded, and the gain waveform is obtained at the decoding side through non-linear interpolation. It should be noted that FIG. 12 indicates a gain value on a vertical axis and a sample position on a horizontal axis.

It is assumed that, at the encoding apparatus 11, the k-th gain sample position G21 and the k+1-th gain sample position G22 are extracted, and the gain code string including gain values, sample lengths and gain inclination values at these gain sample positions is obtained.

Here, an arrow D21 indicates a gain inclination value s[k] at the gain sample position G21, and an arrow D22 indicates a gain inclination value s[k+1] at the gain sample position G22.

It is now assumed that non-linear interpolation using a cubic function is performed at the decoding apparatus 51 based on the gain values, the sample lengths and the gain inclination values included in the gain code string, and a gain waveform indicated with a curve C31 is obtained.

In this example, a difference between the gain waveform indicated with the curve C31 obtained through non-linear interpolation and the gain waveform indicated with a broken line L41 becomes large.

In a scheme for obtaining a gain waveform through non-linear interpolation, when a gain waveform whose gain value linearly changes is encoded as with this example, a difference between the original gain waveform and a gain waveform obtained through non-linear interpolation upon decoding becomes large.

To make this difference small, it is necessary to perform processing (local decoding) of adjusting a gain value and a gain inclination value to be encoded at the encoding apparatus 11 by calculating the gain waveform obtained through non-linear interpolation, which increases a processing amount of encoding.

Therefore, in the present technology, when non-linear interpolation is performed at the decoding apparatus 51, by allowing linear interpolation to be performed under specific conditions, a gain waveform is reproduced with high precision with a less processing amount of encoding.

Specifically, when, for example, a gain value at a sample position between the k-th gain sample position and the k+1-th gain sample position is obtained through interpolation, an intersection X[k, k+1] of two straight line l[k] and straight line l[k+1] is obtained from gain values and gain inclination values at these gain sample positions.

Here, the straight line l[k] is a straight line which passes through the k-th gain sample position (point) on the gain waveform and which has inclination indicated with the gain inclination value s[k]. That is, when a value of the coordinate in the sample axis direction is the same as a value of the k-th gain sample position, the straight line l[k] is a straight line which has a gain value g[k] at the k-th gain sample position as the value of the coordinate in the gain axis direction and which has inclination indicated with the gain inclination value s[k].

In a similar manner, the straight line l[k+1] is a straight line which passes through the k+1-th gain sample position and which has inclination indicated with the gain inclination value s[k+1].

Further, it is determined whether or not a distance between either the k-th gain sample position or the k+1-th gain sample position and the obtained intersection X[k, k+1] is equal to or less than a predetermined threshold. In the determination here, it is determined whether, for example, the following equation (14) holds true.

[Math. 14]

$$((d\_sample[k] \le thre\_sample) \&\& (d\_gain[k] \le thre\_gain)) || ((d\_sample[k+1] \ge thre\_sample) \&\& (d\_gain[k+1] \ge thre\_gain)) \quad (14)$$

It should be noted that, in equation (14), d_sample[k] and d_sample[k+1] respectively indicate distances from the k-th gain sample position and the k+1-th gain sample position to the intersection X[k, k+1] in the sample axis direction. Further, d_gain[k] and d_gain[k+1] respectively indicate distances from the k-th gain sample position and the k+1-th gain sample position to the intersection X[k, k+1] in the gain axis direction, that is, differences of the gain values.

Further, thre_sample and thre_gain respectively indicate a threshold of a distance in the sample axis direction and a threshold of a distance in the gain axis direction.

Therefore, in equation (14), when the distance d_sample[k] is equal to or less than thre_sample, and the distance d_gain[k] is equal to or less than thre_gain, or when the distance d_sample[k+1] is equal to or less than thre_sample and the distance d_gain[k+1] is equal to or less than the threshold thre_gain, a distance from the gain sample position to the intersection X[k, k+1] is equal to or less than a threshold.

For example, when the k-th gain sample position is a head position of the frame, that is, a sample position of n=0, the distance d_sample[k], the distance d_gain[k], the distance d_sample[k+1] and the distance d_gain[k+1] in equation (14) are respectively obtained using the following equation (15) to equation (18). Further, the threshold thre_sample and the threshold thre_gain are, for example, the threshold thre_sample=32 and the threshold thre_gain=0.01.

[Math. 15]

$$d\_sample[k]=abs((g[k+1]-g[k]-s[k+1] \times T[k])/(s[k]-s[k+1])) \quad (15)$$

[Math. 16]

$$d\_gain[k]=abs(s[k] \times (g[k+1]-g[k]-s[k+1] \times T[k])/(s[k]-s[k+1])) \quad (16)$$

[Math. 17]

$$d\_sample[k+1]=abs((g[k+1]-g[k]-s[k+1] \times T[k])/(s[k]-s[k+1])-T[k]) \quad (17)$$

[Math. 18]

$$d\_gain[k+1]=abs(s[k] \times (g[k+1]-g[k]-s[k+1] \times T[k])/(s[k]-s[k+1])+g[k]-g[k+1]) \quad (18)$$

It should be noted that, in equation (15) to equation (18), abs(x) indicates that an absolute value of x is obtained.

When it is determined that such a conditional expression indicated with equation (14) holds true, a gain waveform is obtained through linear interpolation, that is, through calculation of the above-described equation (1). On the other hand, when the conditional expression indicated with equation (14) does not hold true, a gain waveform is obtained through non-linear interpolation, that is, through calculation of the above-described equation (4).

Figure 13:
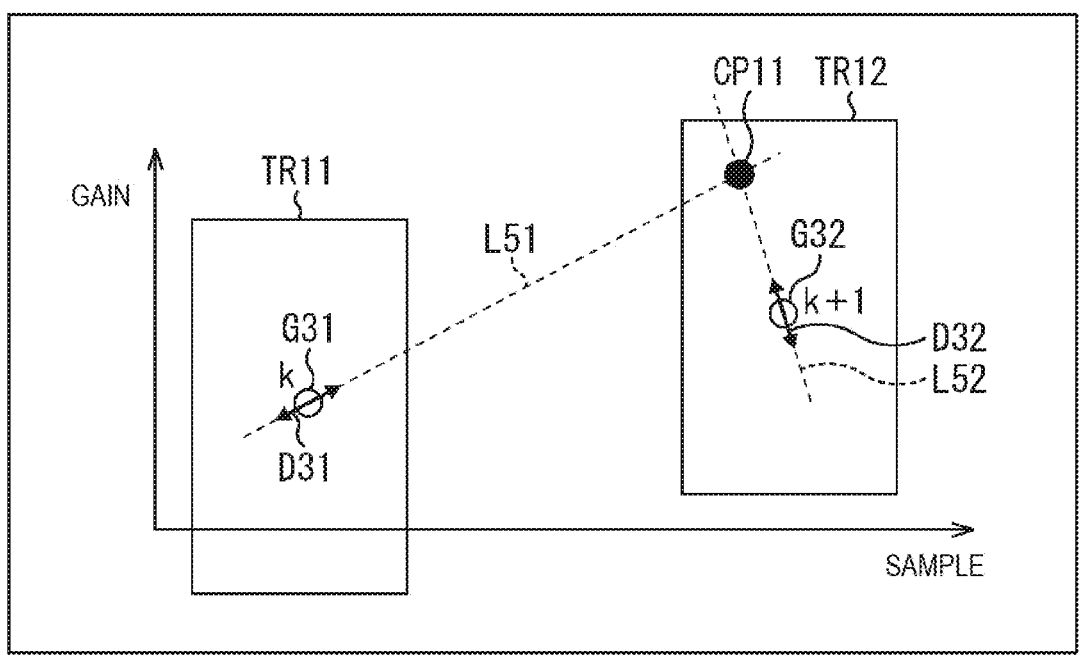
FIG. 13 is a diagram for explaining interpolation of a gain waveform according to an embodiment of the present technology.

For example, as illustrated in FIG. 13, when a gain value at each sample position between the gain sample position G31 and the gain sample position G32 is obtained through interpolation, whether or not the conditional expression indicated with equation (14) holds true is determined by specifying which of a region TR11 and a region TR12 the intersection CP11 is included in. It should be noted that FIG. 13 indicates a gain value on a vertical axis and a sample position within a frame of the time series signal on a horizontal axis.

In FIG. 13, the gain sample position G31 indicates the k-th gain sample position, and the arrow D31 indicates the gain inclination value s[k] at the gain sample position G31. Therefore, the straight line L51 is a straight line l[k].

In a similar manner, the gain sample position G32 indicates the k+1-th gain sample position, and the arrow D32 indicates the gain inclination value s[k+1] at the gain sample position G32. Therefore, the straight line L52 is a straight line l[k+1]. The intersection CP11 which is an intersection of the straight line L51 and the straight line L52 is an intersection X[k, k+1].

It is now assumed that the region TR11 has the gain sample position G31 in the center and has a length in a vertical direction of 2×thre_gain, and a length in a horizontal direction of 2×thre_sample in the drawing. In a similar manner, it is assumed that the region TR12 has the gain sample position G21 in the center and, has a length in a vertical direction of 2×thre_gain and a length in a horizontal direction of 2×thre_sample in the drawing.

In this case, when the intersection CP11 is located within the region TR11 or the intersection CP11 is located within the region TR12, the conditional expression indicated with equation (14) holds true. In the example of FIG. 13, because the intersection CP11 is located within the region TR12, the conditional expression indicated with equation (14) holds true.

In the example illustrated in FIG. 13, the original gain waveform to be reproduced (restored) should have been a waveform close to a waveform constituted with the straight line L51 and the straight line L52. That is, in more detail, the waveform should have been close to the straight line L51 from the gain sample position G31 to the intersection CP11, and should have been close to the straight line L52 from the intersection CP11 to the gain sample position G32.

However, because, in this example, the intersection CP11 is located within the region TR12, and a distance between the intersection CP11 to the gain sample position G32 is sufficiently short, it is possible to determine that the original gain waveform is approximated as a straight line connecting the gain sample position G31 and the gain sample position G32.

In this case, because at the gain waveform between the gain sample position G31 and the gain sample position G32, the gain value can substantially linearly change, it is possible to reproduce the gain waveform with higher precision by obtaining the gain waveform through linear interpolation rather than obtaining the gain waveform through non-linear interpolation. Therefore, in the present technology, when the conditional expression indicated with the above-described equation (14) holds true, the gain waveform is obtained through linear interpolation.

Figure 14:
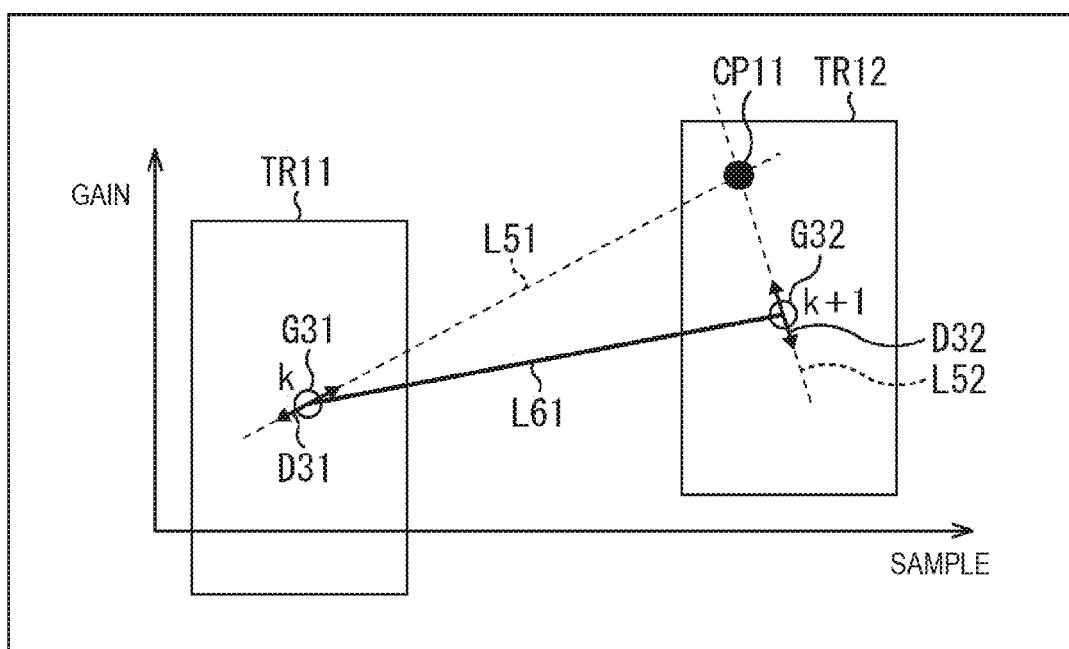
FIG. 14 is a diagram for explaining interpolation of a gain waveform according to an embodiment of the present technology.

Accordingly, in the example of FIG. 13, a gain value at each sample position between the gain sample position G31 and the gain sample position G32 is obtained through linear interpolation, and, by this means, for example, a gain waveform illustrated in FIG. 14 can be obtained. It should be noted that, in FIG. 14, the same reference numerals as those in FIG. 13 are assigned to portions corresponding to those in FIG. 13, and explanation thereof will be omitted as appropriate.

In FIG. 14, a straight line L61 connecting the gain sample position G31 and the gain sample position G32 is obtained as a gain waveform between the gain sample position G31 and the gain sample position G32.

Further, for example, also in the above-described example illustrated in FIG. 12, because the conditional expression indicated with equation (14) holds true, the gain waveform is obtained through linear interpolation.

In the example of FIG. 12, because the intersection X[k, k+1] is located at the gain sample position G22, equation (14) holds true, and a straight line connecting the gain sample position G21 and the gain sample position G22 is set as a gain waveform between the gain sample positions. Therefore, in this example, the original gain waveform is accurately reproduced.

As described above, when non-linear interpolation is basically performed while linear interpolation is performed under specific conditions, it is possible to make a difference between the original gain waveform and the decoded gain waveform smaller without increasing a processing amount of encoding.

Moreover, by employing such a decoding scheme, because both linear interpolation and non-linear interpolation can be performed only with a scheme in which non-linear interpolation is performed, it becomes unnecessary to include the interpolation mode information in the gain code string, so that it is possible to lower a bit rate of the output code string. That is, it is possible to reduce a code amount of the output code string.

<Configuration Example of Decoding Apparatus>

Figure 15:
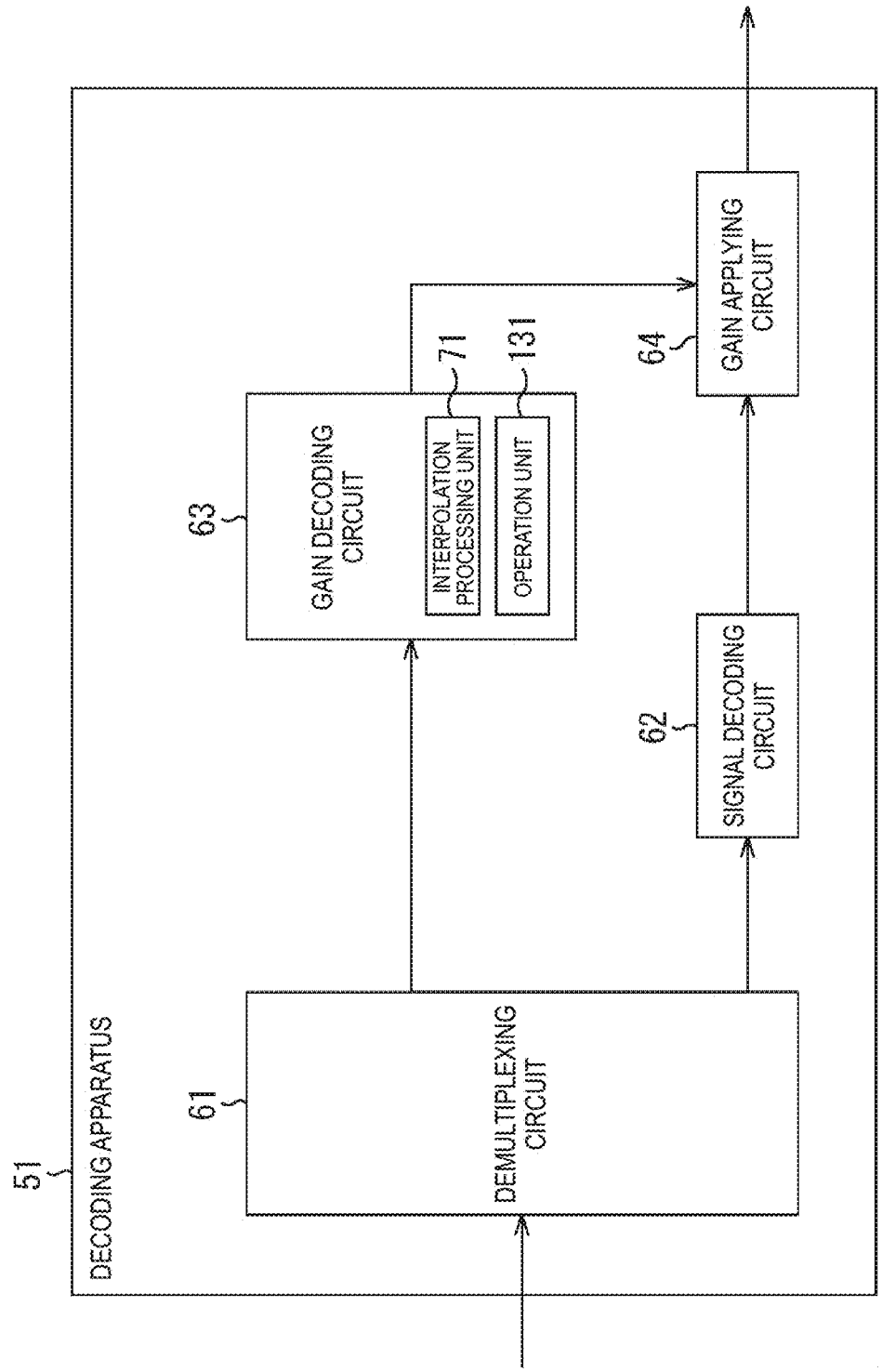
FIG. 15 is a diagram illustrating a configuration example of a decoding apparatus according to an embodiment of the present technology.

When linear interpolation is performed under specific conditions, the decoding apparatus 51 is configured as illustrated in, for example, FIG. 15. It should be noted that, in FIG. 15, the same reference numerals as those in FIG. 7 are assigned to portions corresponding to those in FIG. 7, and explanation thereof will be omitted as appropriate.

The decoding apparatus 51 illustrated in FIG. 15 has a different configuration from that of the decoding apparatus 51 in FIG. 7 in that an operation unit 131 is newly provided at the gain decoding circuit 63 and has the same configuration as that of the decoding apparatus 51 in FIG. 7 in other points.

The operation unit 131 performs calculation of the above-described conditional expression indicated with equation (14).

<Explanation of Gain Decoding Processing>

The gain decoding processing performed when the decoding apparatus 51 is configured as illustrated in FIG. 15 will be described next.

For example, while, at the encoding apparatus 11, the encoding processing described with reference to FIG. 5 is performed, in the gain encoding processing in step S13, the gain code string only including the gain information and not including the interpolation mode information is generated, and the output code string obtained through multiplexing is outputted. Further, in this case, the gain information always includes the gain inclination value.

Figure 16:
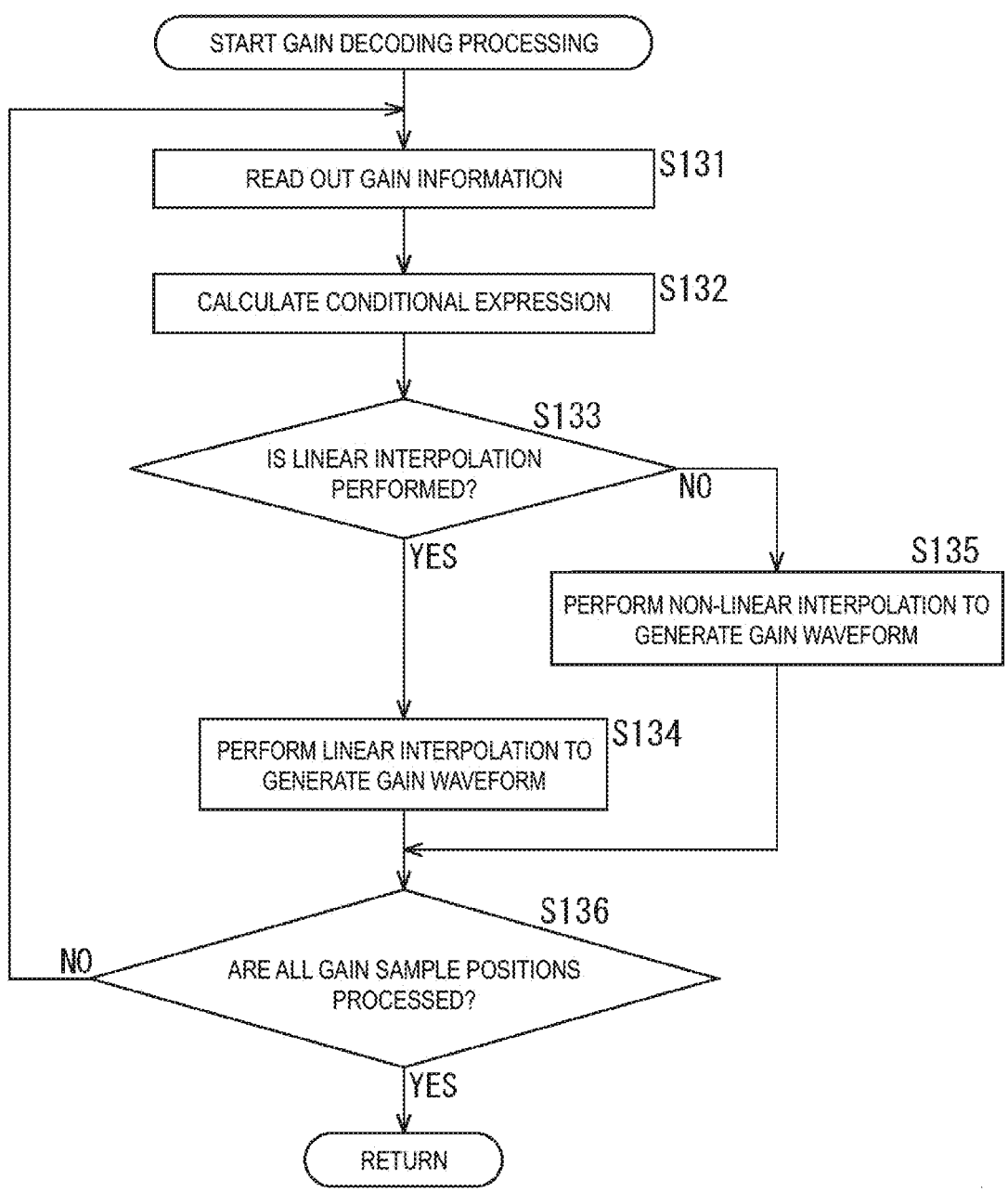
FIG. 16 is a flowchart explaining gain decoding processing according to an embodiment of the present technology.

At the decoding apparatus 51, the decoding processing described with reference to FIG. 8 is performed. However, in the gain decoding processing corresponding to step S43, the gain decoding processing illustrated in FIG. 16 is performed. The gain decoding processing by the decoding apparatus 51 in FIG. 15 will be described below with reference to the flowchart of FIG. 16.

It should be noted that because processing in step S131 is the same as the processing in step S71 in FIG. 9, explanation thereof will be omitted.

In step S132, the operation unit 131 calculates the conditional expression indicated with equation (14) based on the read-out gain information.

That is, the operation unit 131 performs the same calculation as the above-described equation (15) to equation (18) based on the gain value, the sample length and the gain inclination value at the gain sample position read out as the gain information. The operation unit 131 then performs calculation of equation (14) based on a distance from the gain sample position obtained as a result of the calculation to the intersection X[k, k+1].

This calculation of equation (15) to equation (18) is equivalent to obtaining the straight line l[k] and the straight line l[k+1] and obtaining the intersection X[k, k+1] of these straight lines and, further, obtaining differences between the gain values at the k-th gain sample position and the k+1-th gain sample position and the gain value at the intersection X[k, k+1]. Further, calculation of the conditional expression of equation (14) is equivalent to determining whether or not the differences between the gain values at the gain sample positions and the gain value at the intersection X[k, k+1] are equal to or less than a predetermined threshold.

Therefore, at the decoding apparatus 51, it is possible to obtain a gain value at each sample position between the two gain sample positions through linear interpolation or non-linear interpolation according to the differences between the gain values at the gain sample positions and the gain value at the intersection X[k, k+1].

In step S133, the interpolation processing unit 71 determines whether or not linear interpolation is performed based on a calculation result of the conditional expression in step S132. For example, when the conditional expression indicated with equation (14) holds true, it is determined that linear interpolation is performed.

When it is determined in step S133 that linear interpolation is performed, in step S134, the interpolation processing unit 71 performs linear interpolation to generate a gain waveform, and, then, the processing proceeds to step S136. In step S134, the same processing as the processing in step S74 in FIG. 9 is performed.

On the other hand, when it is determined in step S133 that linear interpolation is not performed, in step S135, the interpolation processing unit 71 performs non-linear interpolation to generate a gain waveform, and, then, the processing proceeds to step S136. It should be noted that, in step S135, the same processing as the processing in step S75 in FIG. 9 is performed.

When the gain waveform is generated in step S134 or step S135, the processing in step S136 is performed, and the gain decoding processing ends. Because the processing in step S136 is the same as the processing in step S76 in FIG. 9, explanation thereof will be omitted.

As described above, the decoding apparatus 51 generates a gain waveform through linear interpolation under specific conditions. By this means, it is possible to obtain the original gain waveform with higher precision with a less processing amount and it is possible to reduce a code amount of the output code string.

Modified Example 1 of Third Embodiment

<Interpolation of Gain Value>

It should be noted that, while, in the third embodiment, a case has been described where linear interpolation is performed under specific conditions, it is also possible to perform linear interpolation on the gain value by utilizing the gain sample positions and the intersection.

Figure 17:
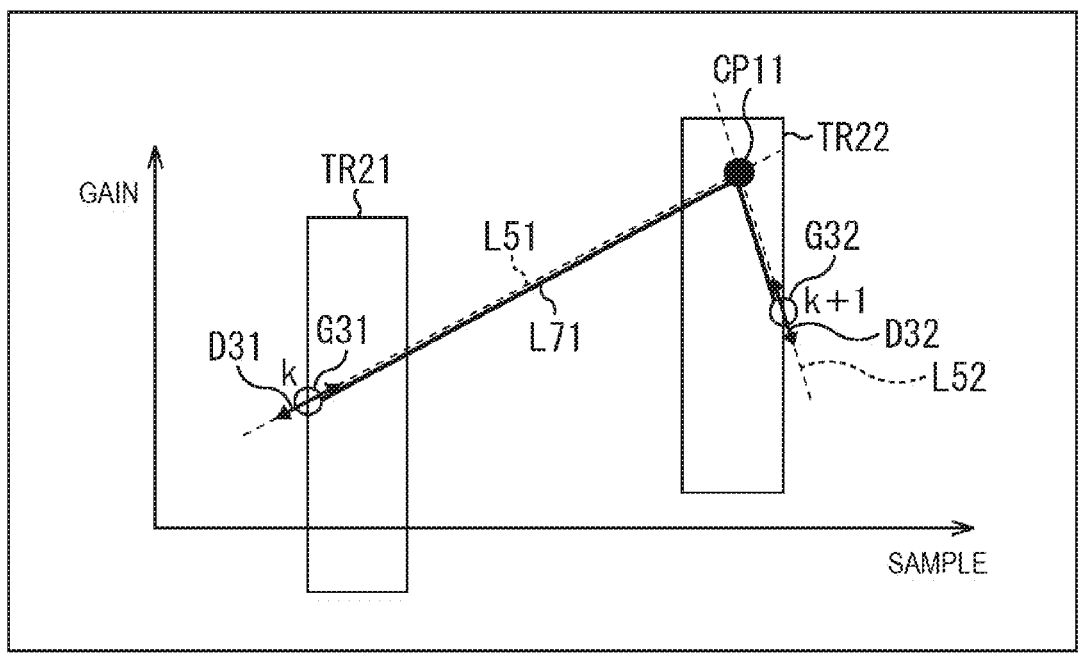
FIG. 17 is a diagram explaining interpolation of a gain waveform according to an embodiment of the present technology.

That is, in the third embodiment, a gain value at each sample position between two gain sample positions is calculated through linear interpolation using equation (1). In the present embodiment, instead, a waveform constituted with straight lines respectively connecting the intersection CP11 of the two straight line L51 and straight line L52 as illustrated in FIG. 17 and two gain sample positions is set as a gain waveform obtained through linear interpolation. It should be noted that, in FIG. 17, the same reference numerals as those in FIG. 13 are assigned to portions corresponding to those in FIG. 13, and explanation thereof will be omitted as appropriate.

In this example, a broken line L71 constituted with a straight line connecting the gain sample position G31 and the intersection CP11 and a straight line connecting the gain sample position G32 and the intersection CP11 is set as a gain waveform between the gain sample position G31 and the gain sample position G32.

In the example of the gain waveform illustrated in FIG. 17, when linear interpolation is performed with the straight line connecting the two gain sample positions, in order to reproduce the gain waveform more accurately, it is necessary to set three or more gain sample positions in a section between the gain sample position G31 and the gain sample position G32 upon encoding of the gain waveform.

That is, if sample positions of the gain sample position G31, the intersection CP11 and the gain sample position G32 are set as the gain sample positions upon encoding of the gain waveform, a difference (error) occurs between the gain waveform before encoded and the gain waveform obtained through decoding.

On the other hand, when the broken line L71 is set as the gain waveform by utilizing the intersection CP11, by only setting two positions of the gain sample position G31 and the gain sample position G32 as the gain sample positions, it is possible to make a difference between the gain waveform before encoded and the gain waveform obtained through decoding smaller. Therefore, in a method in which linear interpolation is performed while utilizing the intersection, it is possible to reduce the number of gain sample positions, and thereby it is possible to suppress a bit rate of the output code string and improve coding efficiency.

It should be noted that, when linear interpolation is performed while utilizing the intersection, the intersection of the two straight lines has to be located between the two gain sample positions.

For example, in the example of FIG. 17, the intersection CP11 has to be located between the gain sample position G31 and the gain sample position G32 in the sample axis direction.

Therefore, a region used for determining whether non-linear interpolation is performed or linear interpolation is performed is different between the example in FIG. 13 and the example in FIG. 17. In the example in FIG. 17, when the intersection CP11 is included in either the region TR21 or the region TR22, linear interpolation utilizing the intersection is performed.

Here, the region TR21 is a right half region of the region TR11 illustrated in FIG. 13, that is, a region at the right side of the region TR11 with respect to the gain sample position G31 in FIG. 13. In a similar manner, the region TR22 is a left half region of the region TR12 illustrated in FIG. 13, that is, a region at the left side of the region TR12 with respect to the gain sample position G32 in FIG. 13.

In this manner, when linear interpolation utilizing the intersection is performed, the conditional expression corresponding to equation (14) is as indicated with the following equation (19). That is, when the following equation (19) holds true, linear interpolation utilizing the intersection is performed.

[Math. 19]

$$((0<d\_sample[k]) \&\&(d\_sample[k] \le thre\_sample) \&\& (d\_gain[k] \le thre\_gain)) \| ((0<d\_sample[k+1]) \&\& (d\_sample[k+1] \le thre\_sample) \&\&(d\_gain[k+1] \le thre\_gain)) \quad (19)$$

In equation (19), when the distance d_sample[k] is greater than zero, and equal to or less than thre_sample, and the distance d_gain[k] is equal to or less than the threshold thre_gain, or when the distance d_sample[k+1] is greater than zero and equal to or less than the threshold thre_sample, and the distance d_gain[k+1] is equal to or less than the threshold thre_gain, the distance from the gain sample position to the intersection X[k, k+1] is equal to or less than a threshold.

For example, when the k-th gain sample position is the head position of the frame, that is, a sample of n=0, the distance d_sample[k], the distance d_gain[k], the distance d_sample[k+1] and the distance d_gain[k+1] in equation (19) are respectively obtained using the following equation (20) to equation (23).

[Math. 20]

$$d\_sample[k]=(g[k+1]-g[k]-s[k+1] \times T[k])/(s[k]-s[k+1]) \quad (20)$$

[Math. 21]

$$d\_gain[k]=abs(s[k] \times (g[k+1]-g[k]-s[k+1] \times T[k])/(s[k]-s[k+1])) \quad (21)$$

[Math. 22]

$$d\_sample[k+1]=T[k]-(g[k+1]-g[k]-s[k+1] \times T[k])/(s[k]-s[k+1]) \quad (22)$$

[Math. 23]

$$d\_gain[k+1]=abs(s[k] \times (g[k+1]-g[k]-s[k+1] \times T[k])/(s[k]-s[k+1])+g[k]-g[k+11]) \quad (23)$$

When it is determined that the conditional expression indicated with equation (19) does not hold true, a gain waveform is obtained through non-linear interpolation, that is, the above-described calculation of equation (4).

On the other hand, when it is determined that the conditional expression indicated with equation (19) holds true, a gain waveform is obtained through linear interpolation.

For example, when the k-th gain sample position is the head position of the frame, that is, a sample position of n=0, when the sample position of the intersection X[k, k+1], that is, a sample length from the k-th gain sample position to the intersection X[k, k+1] is set as T'[k], the sample position T'[k] is obtained from the following equation (24).

[Math. 24]

$$T'[k]=(g[k+1]-g[k]-s[k+1]\times T[k])/(s[k]-s[k+1]) \quad (24)$$

Further, a gain value g_interpolated[n] of the sample n which is located between the k-th gain sample position and the intersection X[k, k+1] and which is the n-th (where 0≤n<T'[k]) sample from the head of the frame is calculated from the following equation (25).

[Math. 25]

$$g\_interpolated[n]=a1[k]\times n+b1[k]$$

$$(0 \le n < T'[k]) \quad (25)$$

It should be noted that, in equation (25), a1[k] and b1[k] are values respectively obtained from the following equation (26) and equation (27).

[Math. 26]

$$a1[k]=s[k] \quad (26)$$

[Math. 27]

$$b1[k]=g[k] \quad (27)$$

a1[k] and b1[k] indicate inclination and intercept of the straight line connecting the k-th gain sample position and the intersection X[k, k+1]. Therefore, in this example, as described with reference to FIG. 17, it is determined that the gain value linearly changes between the k-th gain sample position G31 and the intersection CP11, and a gain value of each sample n is obtained through linear interpolation.

Further, a gain value g_interpolated[n] of the sample n which is located between the intersection X[k, k+1] and the k+1-th gain sample position and which is the n-th (where T'[k]≤n<T[k]) sample from the head of the frame is calculated from the following equation (28).

[Math. 28]

$$g\_interpolated[n]=a2[k]\times n+b2[k]$$

$$(T'[k] \le n < T[k]) \quad (28)$$

It should be noted that, in equation (28), a2[k] and b2[k] are values respectively obtained from the following equation (29) and equation (30).

[Math. 29]

$$a2[k]=s[k+1] \quad (29)$$

[Math. 30]

$$b2[k]=g[k+1]-s[k+1]\times T[k] \quad (30)$$

a2[k] and b2[k] indicate inclination and intercept of the straight line connecting the intersection X[k, k+1] and the k+1-th gain sample position. Therefore, in this example, as described with reference to FIG. 17, it is determined that the gain value linearly changes between the interception CP11 and the k+1-th gain sample position G32, and a gain value of each sample n is obtained through linear interpolation.

As described above, when linear interpolation utilizing the intersection is performed under specific conditions, in the gain decoding processing described with reference to FIG. 16, the operation unit 131 performs calculation of the conditional expression indicated with equation (19) based on the read-out gain information in step S132.

When the conditional expression indicated with equation (19) holds true, in step S134, the interpolation processing unit 71 calculates the sample position T'[k] of the intersection X[k, k+1] using equation (24) based on the gain value, the sample length and the gain inclination value at the gain sample position read out as the gain information. Further, the interpolation processing unit 71 performs calculation of equation (25) and equation (28) using the obtained sample position T'[k] and generates a gain waveform through linear interpolation.

On the other hand, when the conditional expression indicated with equation (19) does not hold true, in step S135, the interpolation processing unit 71 performs non-linear interpolation to generate a gain waveform.

In this manner, by performing linear interpolation utilizing the intersection under specific conditions, it is possible to make a difference between the original gain waveform before encoded and the gain waveform obtained through decoding smaller without increasing a processing amount upon encoding.

Further, because both linear interpolation and non-linear interpolation can be performed only with a scheme in which non-linear interpolation is performed, it becomes unnecessary to include the interpolation mode information in the gain code string, so that it is possible to lower a bit rate of the output code string. That is, it is possible to reduce a code amount of the output code string.

Fourth Embodiment

<Explanation of Gain Decoding Processing>

Further, in the third embodiment and modified example 1 of the third embodiment, a case has been described where the interpolation mode information is not included in the gain code string, and non-linear interpolation is basically performed.

However, while the interpolation mode information is included in the gain code string, and the gain waveform is basically obtained using an interpolation scheme indicated in the interpolation mode information, when the interpolation scheme indicated in the interpolation mode information is a scheme using non-linear interpolation, linear interpolation may be performed under specific conditions.

Figure 18:
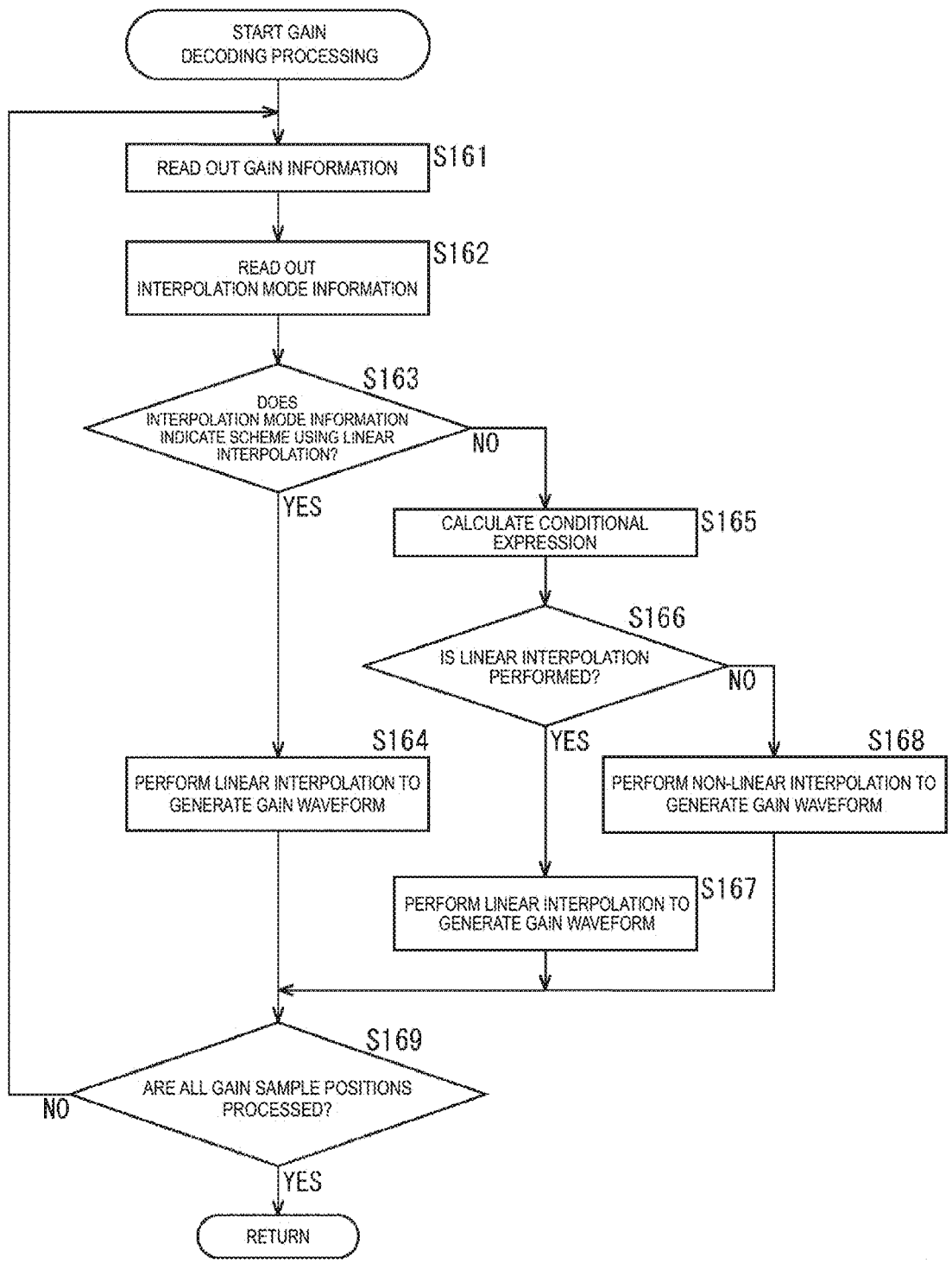
FIG. 18 is a flowchart explaining gain decoding processing according to an embodiment of the present technology.

In such a case, at the decoding apparatus 51, the decoding processing described with reference to FIG. 8 is performed. However, in the gain decoding processing corresponding to step S43, the gain decoding processing illustrated in FIG. 18 is performed. The gain decoding processing by the decoding apparatus 51 in FIG. 15 will be described below with reference to the flowchart of FIG. 18.

It should be noted that because the processing in step S161 to step S164 is the same as the processing in step S71 to step S74 in FIG. 9, explanation thereof will be omitted.

In step S163, when it is determined that the scheme is a scheme using non-linear interpolation, in step S165, the operation unit 131 performs calculation of the conditional expression indicated with equation (14) based on the read-out gain information.

Then, while the processing in step S166 to step S168 is performed, because these processing is the same as the processing in step S133 to step S135 in FIG. 16, explanation thereof will be omitted. It should be noted that, from step S165 to step S168, the processing described in the third embodiment may be performed, or processing described in modified example 1 of the third embodiment may be performed. Further, when non-linear interpolation is performed, limiting processing may be performed.

When a gain waveform is generated through interpolation in step S164, step S167 or step S168, the processing then proceeds to step S169.

In step S169, the gain decoding circuit 63 determines whether or not processing is performed for all the gain sample positions.

When it is determined in step S169 that not all of the gain sample positions is processed, the processing returns to step S161, and the above-described processing is repeated.

On the other hand, when it is determined in step S169 that all of the gain sample positions are processed, the gain decoding circuit 63 supplies the gain waveform corresponding to one frame constituted with gain values at the sample positions obtained through the processing so far to the gain applying circuit 64, and the gain decoding processing ends. When the gain decoding processing ends, the processing then proceeds to step S44 in FIG. 8.

As described above, the decoding apparatus 51 obtains a gain waveform through linear interpolation or non-linear interpolation according to the interpolation mode information. By obtaining the gain waveform through non-linear interpolation as appropriate in this manner according to the interpolation mode information, it is possible to reproduce a gain waveform with high precision with a less code amount.

Moreover, even when the interpolation scheme indicated in the interpolation mode information is a scheme using non-linear interpolation, by performing linear interpolation under specific conditions, it is possible to reproduce the original gain waveform with higher precision with a less processing amount of encoding. Further, it is possible to reduce a code amount of the output code string.

The series of processes described above can be executed by hardware but can also be executed by software. When the series of processes is executed by software, a program that constructs such software is installed into a computer. Here, the expression "computer" includes a computer in which dedicated hardware is incorporated and a general-purpose personal computer or the like that is capable of executing various functions when various programs are installed.

FIG. 19 is a block diagram showing a hardware configuration example of a computer that performs the above-described series of processing using a program.

In such computer, a CPU (Central Processing Unit) 501, a ROM (Read Only Memory) 502, and a RAM (Random Access Memory) 503 are connected to one another by a bus 504.

An input/output interface 505 is also connected to the bus 504. An input unit 506, an output unit 507, a recording unit 508, a communication unit 509, and a drive 510 are connected to the input/output interface 505.

The input unit 506 is configured from a keyboard, a mouse, a microphone, an imaging device or the like. The output unit 507 is configured from a display, a speaker or the like. The recording unit 508 is configured from a hard disk, a non-volatile memory or the like. The communication unit 509 is configured from a network interface or the like. The drive 510 drives a removable medium 511 such as a magnetic disk, an optical disk, a magneto-optical disk, a semiconductor memory or the like.

In the computer configured as described above, as one example the CPU 501 loads a program recorded in the recording unit 508 via the input/output interface 505 and the bus 504 into the RAM 503 and executes the program to carry out the series of processes described earlier.

Programs to be executed by the computer (the CPU 501) are provided being recorded in the removable medium 511 which is a packaged medium or the like. Also, programs may be provided via a wired or wireless transmission medium, such as a local area network, the Internet or digital satellite broadcasting.

In the computer, by loading the removable recording medium 511 into the drive 510, the program can be installed into the recording unit 508 via the input/output interface 505. It is also possible to receive the program from a wired or wireless transfer medium using the communication unit 509 and install the program into the recording unit 508. As another alternative, the program can be installed in advance into the ROM 502 or the recording unit 508.

It should be noted that the program executed by a computer may be a program that is processed in time series according to the sequence described in this specification or a program that is processed in parallel or at necessary timing such as upon calling.

An embodiment of the present technology is not limited to the embodiments described above, and various changes and modifications may be made without departing from the scope of the present technology.

For example, the present technology can adopt a configuration of cloud computing which processes by allocating and connecting one function by a plurality of apparatuses through a network.

Further, each step described by the above mentioned flow charts can be executed by one apparatus or by allocating a plurality of apparatuses.

In addition, in the case where a plurality of processes is included in one step, the plurality of processes included in this one step can be executed by one apparatus or by allocating a plurality of apparatuses.

The advantageous effects described herein are not limited, but merely examples. Any other advantageous effects may also be attained.

Additionally, the present technology may also be configured as below.

(1)

A decoding apparatus including:

a gain readout unit configured to read out encoded gain values at at least two gain sample positions of a time series signal;

an interpolation information readout unit configured to read out interpolation information indicating whether the gain value at each sample position of the time series signal is obtained through linear interpolation or obtained through non-linear interpolation; and an interpolation processing unit configured to obtain the gain value at each sample position located between the two gain sample positions of the time series signal based on the gain values at the gain sample positions through linear interpolation or non-linear interpolation according to the interpolation information.

(2)

The decoding apparatus according to (1), wherein the gain readout unit further reads out gain inclination values indicating inclination of the gain values at the gain sample positions, and wherein, when the gain value is obtained through non-linear interpolation, the interpolation processing unit obtains the gain value at each sample position located between the two gain sample positions based on the gain values and the gain inclination values at the gain sample positions.

(3)
The decoding apparatus according to (1) or (2), further including: a limiting processing unit configured to perform limiting processing on the gain value obtained through non-linear interpolation so that the gain value becomes a value equal to or greater than a predetermined lower limit or a value equal to or less than a predetermined upper limit.

(4)
The decoding apparatus according to (3),
wherein the limiting processing unit performs limiting processing using zero as the lower limit, limiting processing using one as the lower limit or limiting processing using one as the upper limit.

(5)
The decoding apparatus according to any one of (2) to (4), further including:
an operation unit configured to obtain at the gain sample positions, straight lines having the gain values at the gain sample positions and having inclination indicated by the gain inclination values at the gain sample positions, and obtain differences between a gain value at an intersection of the straight lines obtained for the two gain sample positions and the gain values at the two gain sample positions,
wherein, when the interpolation information is information indicating that the gain value is obtained through linear interpolation, the interpolation processing unit obtains the gain value through linear interpolation, and, when the interpolation information is information indicating that the gain value is obtained through non-linear interpolation, the interpolation processing unit obtains the gain value through non-linear interpolation or linear interpolation according to the differences.

(6)
A decoding method including the steps of:
reading out encoded gain values at at least two gain sample positions of a time series signal;
reading out interpolation information indicating whether the gain value at each sample position of the time series signal is obtained through linear interpolation or obtained through non-linear interpolation; and
obtaining the gain value at each sample position located between the two gain sample positions of the time series signal based on the gain values at the gain sample positions through linear interpolation or non-linear interpolation according to the interpolation information.

(7)
A program causing a computer to execute processing including the steps of:
reading out encoded gain values at at least two gain sample positions of a time series signal;
reading out interpolation information indicating whether the gain value at each sample position of the time series signal is obtained through linear interpolation or obtained through non-linear interpolation; and
obtaining the gain value at each sample position located between the two gain sample positions of the time series signal based on the gain values at the gain sample positions through linear interpolation or non-linear interpolation according to the interpolation information.

(8)
A decoding apparatus including:
a gain readout unit configured to read out encoded gain values at at least two gain sample positions of a time series signal and gain inclination values indicating inclination of the gain values;
an operation unit configured to obtain at the gain sample positions, straight lines having the gain values at the gain sample positions and having inclination indicated by the gain inclination values at the gain sample positions, and obtain differences between a gain value at an intersection of the straight lines obtained for the two gain sample positions and the gain values at the two gain sample positions; and
an interpolation processing unit configured to obtain the gain value at each sample position located between the two gain sample positions of the time series signal through linear interpolation or non-linear interpolation according to the differences.

(9)
A decoding method including the steps of:
reading out encoded gain values at at least two gain sample positions of a time series signal and gain inclination values indicating inclination of the gain values;
obtaining at the gain sample positions, straight lines having the gain values at the gain sample positions and having inclination indicated by the gain inclination values at the gain sample positions, and obtaining differences between a gain value at an intersection of the straight lines obtained for the two gain sample positions and the gain values at the two gain sample positions; and
obtaining the gain value at each sample position located between the two gain sample positions of the time series signal through linear interpolation or non-linear interpolation according to the differences.

(10)
A program causing a computer to execute processing including the steps of:
reading out encoded gain values at at least two gain sample positions of a time series signal and gain inclination values indicating inclination of the gain values;
obtaining at the gain sample positions, straight lines having the gain values at the gain sample positions and having inclination indicated by the gain inclination values at the gain sample positions and obtaining differences between a gain value at an intersection of the straight lines obtained for the two gain sample positions and the gain values at the two gain sample positions; and
obtaining the gain value at each sample position located between the two gain sample positions of the time series signal through linear interpolation or non-linear interpolation according to the differences.

REFERENCE SIGNS LIST

51 decoding apparatus
61 demultiplexing circuit
62 signal decoding circuit
63 gain decoding circuit
64 gain applying circuit
71 interpolation processing unit
101 limiting processing unit
131 operation unit

The invention claimed is:
1. A decoding apparatus comprising:
processing circuitry configured to:
read out, from a code string, encoded gain values at least at two gain sample positions at different times in a time series signal;

read out, from the code string, interpolation information indicating an interpolation mode used to obtain the gain value at each sample position of the time series signal; and obtain the gain value at each sample position located at a time between the two gain sample positions of the time series signal based on the gain values at the gain sample positions through non-linear interpolation, in response to the interpolation information indicating non-linear interpolation.

2. The decoding apparatus according to claim 1, wherein the processing circuitry is configured to read out gain inclination values indicating inclination of the gain values at the gain sample positions, and, when the gain value is obtained through non-linear interpolation, to obtain the gain value at each sample position located between the two gain sample positions based on the gain values and the gain inclination values at the gain sample positions.

3. The decoding apparatus according to claim 1, wherein the processing circuitry is further configured to perform limiting processing on the gain value obtained through non-linear interpolation so that the gain value becomes a value equal to or greater than a predetermined lower limit or a value equal to or less than a predetermined upper limit.

4. The decoding apparatus according to claim 3, wherein the processing circuitry is configured to perform limiting processing using zero as the lower limit, limiting processing using one as the lower limit or limiting processing using one as the upper limit.

5. The decoding apparatus according to claim 2, wherein the processing circuitry is further configured to obtain at the gain sample positions, straight lines having the gain values at the gain sample positions and having inclination indicated by the gain inclination values at the gain sample positions, and to obtain differences between a gain value at an intersection of the straight lines obtained for the two gain sample positions and the gain values at the two gain sample positions, wherein, when the interpolation information is information indicating that the gain value is obtained through linear interpolation, the processing circuitry is configured to obtain the gain value through linear interpolation, and, when the interpolation information is information indicating that the gain value is obtained through non-linear interpolation, the processing circuitry is configured to obtain the gain value through non-linear interpolation or linear interpolation according to the differences.

6. A decoding method comprising:

reading out, from a code string, encoded gain values at least at two gain sample positions at different times in a time series signal;

reading out, from the code string, interpolation information indicating an interpolation mode used to obtain the gain value at each sample position of the time series signal; and obtaining the gain value at each sample position located at a time between the two gain sample positions of the time series signal based on the gain values at the gain sample positions through non-linear interpolation, in response to the interpolation information indicating non-linear interpolation.

7. A non-transitory computer readable medium storing instructions that, when executed by processing circuitry, performs a decoding method comprising:

reading out, from a code string, encoded gain values at least at two gain sample positions at different times in a time series signal;

reading out, from the code string, interpolation information indicating an interpolation mode used to obtain the gain value at each sample position of the time series signal; and obtaining the gain value at each sample position located at a time between the two gain sample positions of the time series signal based on the gain values at the gain sample positions through non-linear interpolation, in response to the interpolation information indicating non-linear interpolation.

8. The decoding apparatus according to claim 1, wherein the non-linear interpolation uses a quadratic function or a cubic function.

9. The decoding method according to claim 6, wherein the non-linear interpolation uses a quadratic function or a cubic function.

10. The non-transitory computer readable medium according to claim 7, wherein the non-linear interpolation uses a quadratic function or a cubic function.

\* \* \* \* \*